(12) United States Patent
Patton et al.

(10) Patent No.: US 11,496,229 B2
(45) Date of Patent: Nov. 8, 2022

(54) ANTENNA DETECTION USING ANTENNA RETURN LOSS

(71) Applicant: Neptune Technology Group Inc., Tallassee, AL (US)

(72) Inventors: Damon Lloyd Patton, Wetumpka, AL (US); Gary Wayne Hamilton, II, Auburn, AL (US)

(73) Assignee: Neptune Technology Group Inc., Tallassee, AL (US)

( * ) Notice: Subject to any disclaimer, the term of this patent is extended or adjusted under 35 U.S.C. 154(b) by 306 days.

(21) Appl. No.: 16/832,483

(22) Filed: Mar. 27, 2020

(65) Prior Publication Data
US 2020/0313711 A1   Oct. 1, 2020

Related U.S. Application Data

(60) Provisional application No. 62/825,885, filed on Mar. 29, 2019, provisional application No. 62/828,105, (Continued)

(51) Int. Cl.
*H04B 17/20* (2015.01)
*H01Q 1/50* (2006.01)
(Continued)

(52) U.S. Cl.
CPC ............... *H04B 17/20* (2015.01); *H01Q 1/50* (2013.01); *H03F 3/20* (2013.01); *H04B 1/0458* (2013.01);
(Continued)

(58) Field of Classification Search
CPC ........ H04B 17/20; H04B 1/0458; H04B 1/18; H04B 7/0608; H04B 17/00;
(Continued)

(56) References Cited

U.S. PATENT DOCUMENTS 5,471,146 A   11/1995   Krayeski et al.
5,493,650 A   2/1996    Reinke et al.
(Continued)

FOREIGN PATENT DOCUMENTS

CN   101217303 A   7/2008
CN   101299644 B   11/2008
(Continued)

*Primary Examiner* — Don P Le
(74) *Attorney, Agent, or Firm* — Snyder, Clark, Lesch & Chung, LLP

(57) ABSTRACT

A system includes a radio frequency (RF) connector terminal that is configured to connect to an antenna, and a RF transmitter that transmits RF power to the RF connector terminal. The system further includes a power measurement unit that measures, as a first power measurement, first RF power of the RF transmitter power that is reflected via the RF connector terminal, and a controller that causes a transmission path discontinuity between the RF transmitter and the RF connector terminal. The power measurement unit further measures, as a second power measurement, second RF power of the RF transmitter power that is reflected from the discontinuity. The controller further determines if a first antenna is connected to the RF connector terminal based on the first and second power measurements.

24 Claims, 16 Drawing Sheets

Related U.S. Application Data filed on Apr. 2, 2019, provisional application No. 62/835,669, filed on Apr. 18, 2019.

(51) Int. Cl.
*H04B 17/00* (2015.01)
*H03F 3/20* (2006.01)
*H04B 1/04* (2006.01)
*H04B 1/18* (2006.01)
*H04B 7/06* (2006.01)

(52) U.S. Cl.
CPC ............ *H04B 1/18* (2013.01); *H04B 7/0608* (2013.01); *H04B 17/00* (2013.01); *H03F 2200/451* (2013.01); *H04B 2001/0408* (2013.01)

(58) Field of Classification Search
CPC .......... H04B 2001/0408; H04B 1/48; H04B 17/103; H01Q 1/50; H03F 3/20; H03F 2200/451; H03F 3/24
See application file for complete search history.

(56) References Cited

U.S. PATENT DOCUMENTS

| | | | |
|---|---|---|---|
| 5,568,610 A | 10/1996 | Brown | |
| 6,594,508 B1 | 7/2003 | Ketonen | |
| 6,741,640 B1 | 5/2004 | Johnson | |
| 6,931,234 B1 | 8/2005 | Higashi | |
| 7,773,956 B2 | 8/2010 | Fukamachi et al. | |
| 8,174,364 B2 | 5/2012 | Pedigo | |
| 8,515,496 B2 | 8/2013 | Cheng et al. | |
| 9,368,008 B2 | 6/2016 | Jefferies et al. | |
| 9,680,219 B2 | 6/2017 | Filipovic et al. | |
| 9,762,039 B2 | 9/2017 | Barker et al. | |
| 10,129,003 B2 | 11/2018 | Abdelmonem et al. | |
| 2009/0160784 A1 | 6/2009 | Ishida | |
| 2013/0210477 A1 | 8/2013 | Peter | |
| 2017/0294974 A1 | 10/2017 | Casati et al. | |
| 2018/0115197 A1 | 4/2018 | Li et al. | |
| 2018/0317160 A1 | 11/2018 | Jacops et al. | |
| 2020/0007092 A1* | 1/2020 | Wang | H03F 1/565 |
| 2020/0275386 A1* | 8/2020 | Liu | H04W 52/325 |
| 2021/0408671 A1* | 12/2021 | Kim | H01Q 21/28 |
| 2021/0408685 A1* | 12/2021 | Chang | H01Q 1/22 |
| 2022/0038921 A1* | 2/2022 | Wu | H04L 1/1893 |

FOREIGN PATENT DOCUMENTS

| | | |
|---|---|---|
| CN | 102882547 A | 1/2013 |
| CN | 104244291 A | 12/2014 |
| CN | 106788575 A | 5/2017 |
| CN | 107592378 A | 1/2018 |
| JP | H1013365 A | 1/1998 |
| JP | 2005-311536 A | 11/2005 |
| JP | 2006287298 A | 10/2006 |
| WO | 2018/067612 A2 | 4/2018 |
| WO | 2018/191129 A1 | 10/2018 |

* cited by examiner

ANTENNA DETECTION USING ANTENNA RETURN LOSS

CROSS-REFERENCE TO RELATED APPLICATION

This application claims priority under 35 U.S.C. § 119, based on U.S. Provisional Application No. 62/825,885, filed Mar. 29, 2019; U.S. Provisional Application No. 62/828,105, filed Apr. 2, 2019; and U.S. Provisional Application No. 62/835,669, filed Apr. 18, 2019; the disclosures of which are hereby incorporated by reference herein.

BACKGROUND

Numerous wireless devices include an external antenna terminal for connecting an external antenna to the devices' transceiver. Presently, such devices detect the presence of the external antenna connected to the devices' external radio frequency (RF) connector or port through a mechanical switch integrated into the connector. The integrated mechanical switch creates a direct current (DC) short to ground on the external RF connector's signal lead when no external connection is made to the connector. When an external connection is made (e.g., the external antenna is connected to the external RF connector), the integrated mechanical switch opens the DC path to ground on the RF connector's signal lead. The presence of a short to ground, or an open path to ground, on the RF connector's signal lead may be detected by circuitry such that the presence of absence of a physical connection to the external RF connector may be identified. The RF connector's integrated mechanical switch, therefore, acts as a proxy to indicate to the wireless device that an external antenna is, or is not, connected to the external RF connector.

DETAILED DESCRIPTION OF THE PREFERRED EMBODIMENTS

Figure 1:
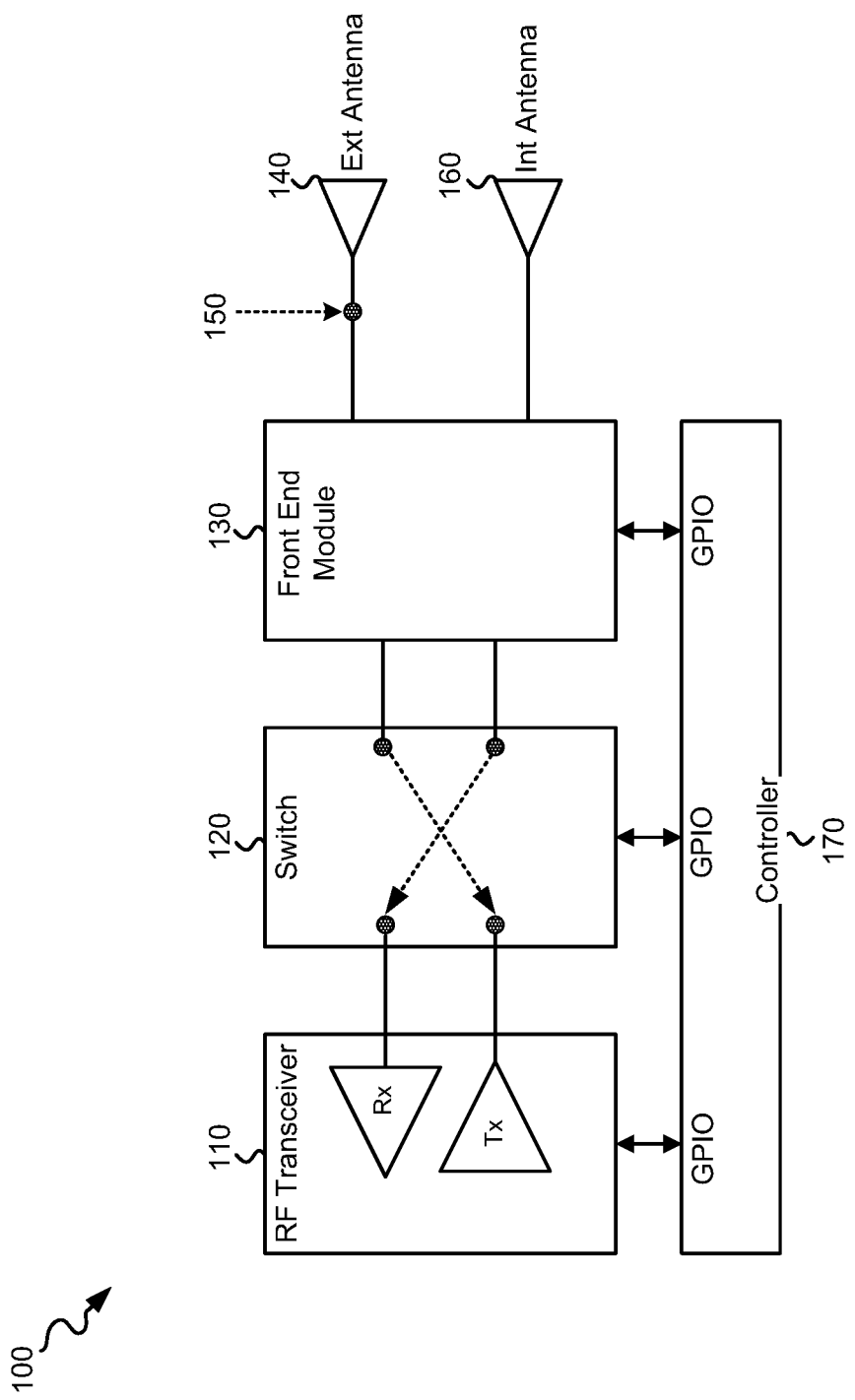
FIG. 1 is a block diagram of a wireless device according to an exemplary implementation.

The following detailed description refers to the accompanying drawings. The same reference numbers in different drawings may identify the same or similar elements. The following detailed description does not limit the invention.

When detecting the presence or absence of an external antenna, the mechanical switch that is integrated into external RF connectors has a number of deficiencies. The integrated switch is susceptible to mechanical failure, reducing its reliability. Additionally, use of the integrated mechanical switch for detecting the presence or absence of an external antenna enables the determination of only two states of the external antenna relative to the RF connector—either unconnected (a short to ground), or connected (a DC open to ground). Use of a conventional integrated mechanical switch does not enable any type of assessment of the quality or health of the connected external antenna.

Exemplary embodiments, described herein, enable detection of the presence or absence of an external antenna at a wireless device using a solid-state solution that additionally permits an assessment of the quality of the connected external antenna. Implementations described herein use measurements of forward power and reflected power, measured between a transmitter output and antenna connector terminal, to determine whether an antenna is connected to the antenna connector terminal. In a first mode, the transmitter output is connected through to the antenna connector terminal and power reflected via the antenna connector terminal, either from an open connection at the antenna connector terminal itself or from an antenna connected to the antenna connector terminal, is measured as the reflected power. In a second mode, a discontinuity is introduced along at a point along a transmission path near the antenna connector terminal. The discontinuity may, for example, include an RF short to ground across the transmission path, or an RF open in the transmission path, that causes the RF power transiting the transmission path to reflect from the discontinuity. The power reflecting from the discontinuity, representing substantially all of the transmitted power, is measured as the forward power. A return loss may then be determined based on the measured reflected power and forward power. Presence or absence of an antenna connected or coupled to the antenna connector terminal can be determined based on the return loss. Additionally, since return loss is related to the Standing Wave Ratio (SWR) and reflection coefficient characteristics of the antenna, the determined return loss may be used to determine a quality, type, and/or model of the antenna connected to the antenna connector terminal. In another embodiment, described with respect to FIGS. 8A and 8B below, two directional couplers are coupled together to enable the measurement of forward and reflected power without having to introduce a discontinuity along the transmission path near the antenna connector terminal.

FIG. 1 is a block diagram of a wireless device 100 according to an exemplary implementation. Wireless device 100 may include a RF transceiver 110, a switch 120, a front-end module (FEM) 130, an external antenna 140, an external antenna RF connector terminal 150, an internal antenna 160, and a controller 170.

RF transceiver 110 includes at least one receiver (Rx) and at least one transmitter (Tx) for receiving RF signals, and for transmitting RF signals, via either external antenna 140 or internal antenna 160. The transmitted RF power signals, used for the return loss RF power measurements (e.g., $P_{Ref}$ and $P_{For}$ measurements described below), may include regular data transmissions, such as transmitted during normal operation of wireless device 100, or may include special test signals that are transmitted by the transmitter Tx of RF transceiver 110 specifically for conducting the return loss RF power measurements. RF transceiver 110 may additionally include, in some implementations, RF power measurement circuitry for measuring a level of RF power associated with a signal(s) received at the input of the receiver Rx of RF transceiver 110.

Switch 120 may, in one implementation, include solid-state circuitry for implementing a switching mechanism that selectively switches either: 1) the receiver Rx input to external antenna 140 and the transmitter Tx output to the internal antenna 160, or 2) the receiver Rx input to the internal antenna 160 and the transmitter Tx output to the external antenna 140. Switch 120 may, in one implementation, be implemented as a dual-pole, dual-throw (DPDT) "cross-over" switch.

FEM 130 may include a module that includes various functional components associated with RF reception and transmission. The functional components may include, but are not limited to, a power amplifier(s), a mixer(s), a filter(s), a switch(es), and a matching circuit(s). As described further with respect to FIGS. 2A-6B and 8A-8B below, FEM 130 may additionally include one or more directional couplers and, in some implementations, a switch. The one or more directional couplers may be used in an antenna detection and assessment process described further below with respect to FIGS. 2A-9. The switch may, in one implementation, selectively cause a transmission discontinuity at, or near, RF connector terminal 150. To cause the transmission discontinuity, the switch may either: 1) selectively couple the RF output from the transmitter Tx to ground, or 2) selectively create an open connection between the transmitter Tx RF output and RF antenna connector terminal 105. In one exemplary implementation, the switch may include a single pole, singe throw (SPST) switch. In another implementation, the switch may, as described with respect to FIGS. 8A and 8B below, include a single pole, double throw (SPDT) switch that selectively switches RF power measurements from two different directional couplers through which RF power transits from the RF transceiver 110 to an external antenna connector terminal 150.

External antenna 140 connects to FEM 130 via external antenna RF connector terminal 150. External antenna 140 may, therefore, be connected to, or disconnected from, wireless device 100 via external antenna RF connector terminal 150. External antenna 140 may include any type of antenna for receiving and transmitting RF signals. The particular type of antenna, and the performance parameters associated with the antenna, may be selected based on the particular type of wireless device 100. For example, if wireless device 100 is a Bluetooth™ capable device, then external antenna 140 may include an antenna whose performance parameters enable the antenna to receive and transmit Bluetooth™ RF signals. As another example, if wireless device 100 is a Wi-Fi capable device (i.e., a device performing RF communication according to the IEEE 802.11 standards), then external antenna 140 may include an antenna whose performance parameters enable the antenna to receive and transmit Wi-Fi signals. Wireless device 100, though, may include other types of RF devices that operate with different performance parameters.

Internal antenna 160 connects to FEM 130 and may be located internally (i.e., within the housing holding the components of the wireless device 100). Internal antenna 160 may also include any type of antenna for receiving and transmitting RF signals. The particular type of antenna, and the performance parameters associated with the antenna, may be selected based on the particular type of wireless device 100. In some implementations, the internal antenna 160 may be a same type of antenna, with the same performance parameters, as external antenna 140. In other implementations, the internal antenna 160 may be a different type of antenna, with different performance parameters, than external antenna 140.

Controller 170 may include one or more processors, microprocessors, or microcontrollers that interpret and execute instructions, and/or may include logic circuitry (e.g., a field-programmable gate array (FPGA), an application specific integrated circuit (ASIC), etc.) that executes one or more processes/functions. Controller 170 may include multiple General-Purpose Input/Output (GPIO) ports for receiving and sending data, including sending control instructions and receiving control acknowledgements, from the components of wireless device 100, such as RF transceiver 110, switch 120, and/or FEM 130. Controller 170 may additionally, include, or be connected to, memory storage (not shown in FIG. 1) for storing data and/or instructions. The memory storage may include a dynamic and/or static storage device(s). The memory storage may also be referred to herein as a "non-transitory computer-readable medium" or a "non-transitory storage medium."

Wireless device 100 may include any type of device that communicates using wireless mechanisms (e.g., via radio frequencies). For example, wireless device 100 may be part of, or couple/connect to, a meter or meter interface unit (MIU), such as a MIU associated with a water usage meter or a power usage meter. If part of, or coupled to, a water usage meter, wireless device 100 may transmit water consumption data, and water meter/MIU status information, to a water utility. Wireless device 100 may additionally transmit data indicating the presence/absence of an antenna of the water meter/MIU and/or data associated with a quality, type, and/or model of the antenna of the water meter/MIU. If part of, or coupled to, a power usage meter, wireless device 100 may transmit power consumption data, and power meter/MIU status information, to a power utility. Wireless device 100 may additionally transmit data indicating the presence/absence of an antenna of the power meter/MIU and/or data associated with a quality, type, and/or model of the antenna of the power meter/MIU.

Figure 2A:
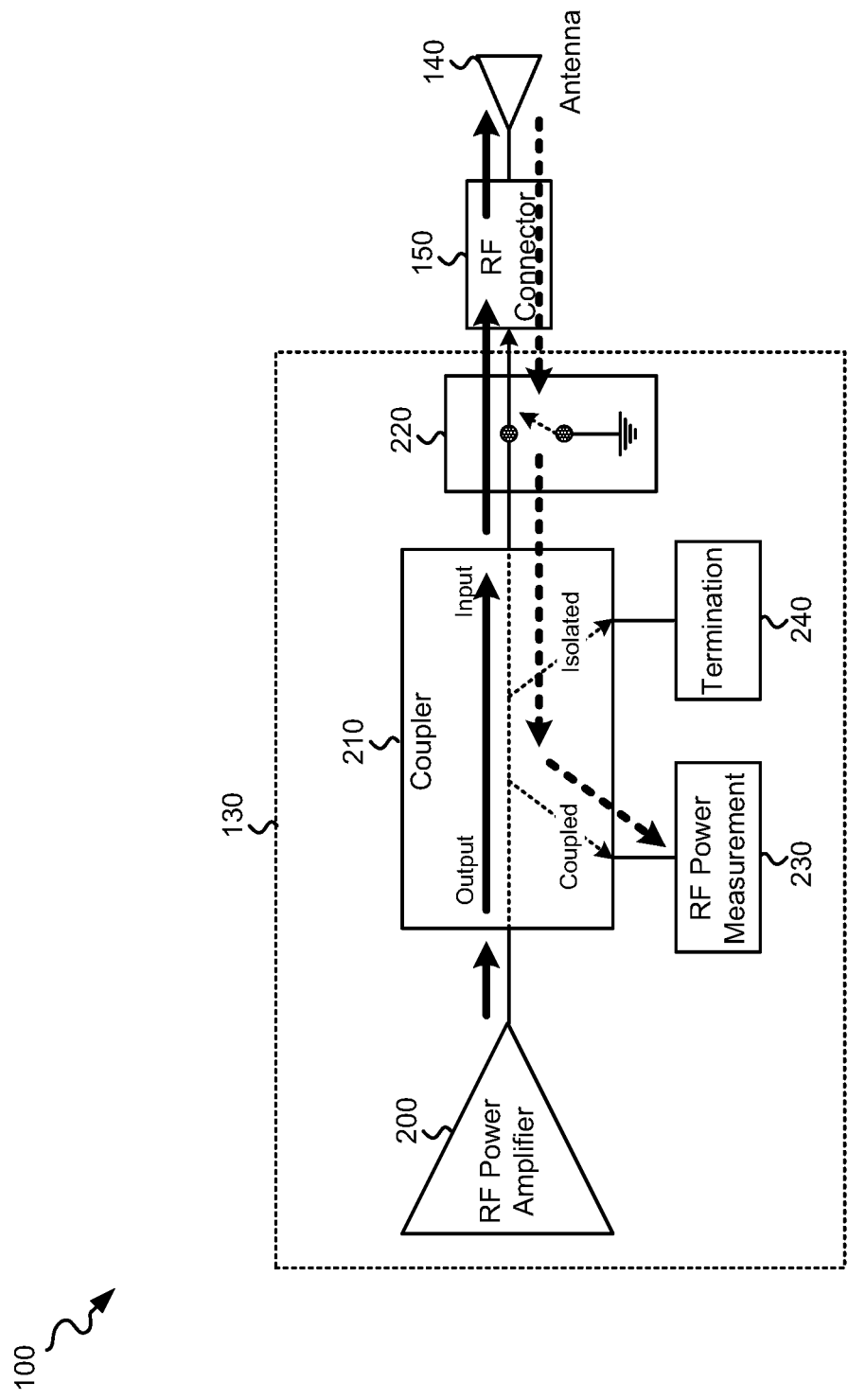
FIGS. 2A and 2B illustrate the detection of the presence or absence of an external antenna, based on return loss measurements, in an exemplary implementation in which a switch causes a transmission discontinuity by selectively coupling the transmitter RF output to ground.
Figure 2B:
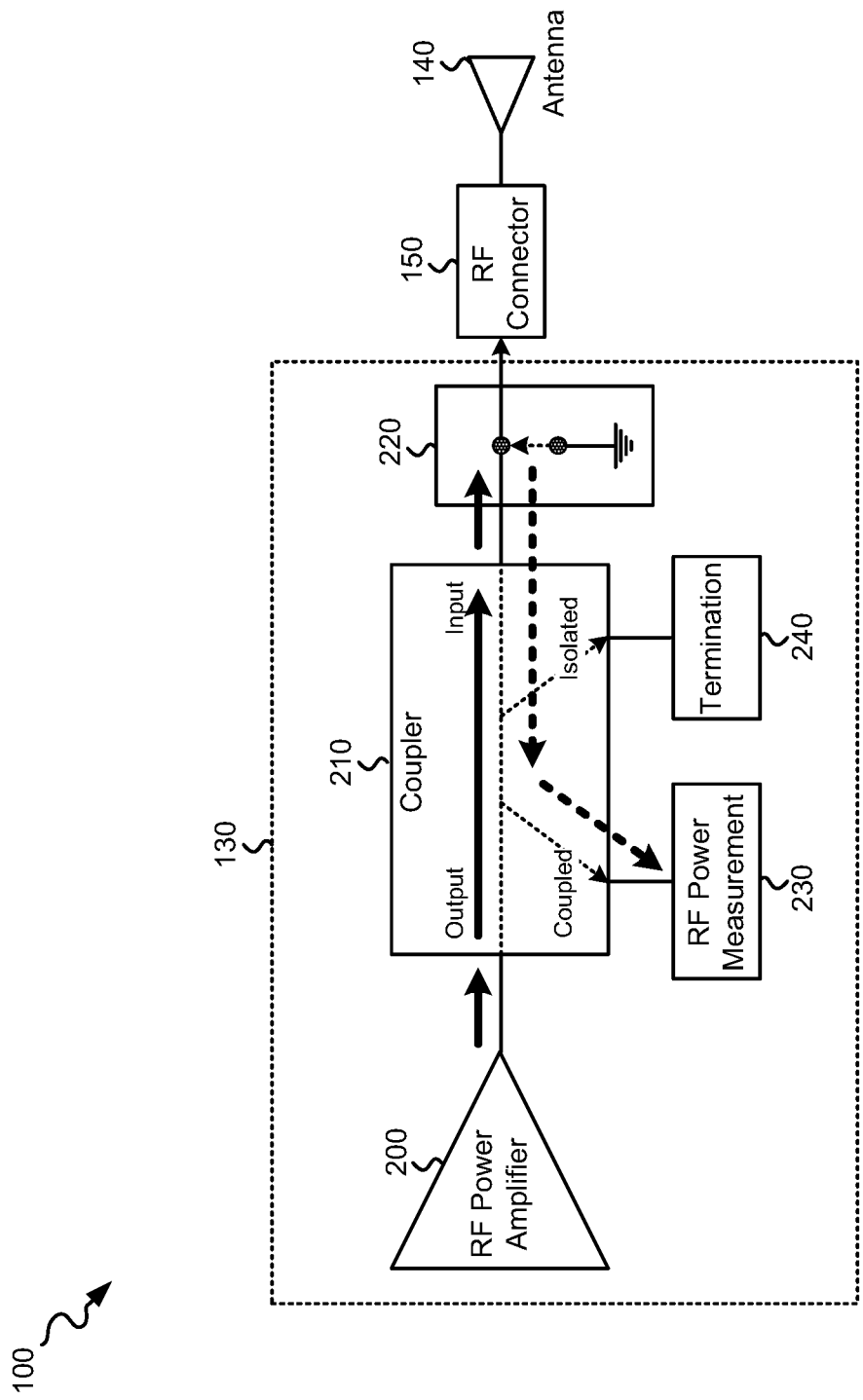

FIGS. 2A and 2B illustrate an overview of the detection of the presence or absence of an external antenna 140 at wireless device 100, based on return loss measurements, in an exemplary implementation in which a switch causes a transmission discontinuity by selectively coupling the transmitter Tx RF output to ground. As shown in FIG. 2A, FEM 130 of wireless device 100 may include a RF power amplifier (PA) 200, a directional coupler 210, a switch 220, a RF power measurement unit 230, and a termination 240.

The input of RF power amplifier (PA) 200 connects to the output of transmitter Tx of RF transceiver 110 via switch 120 (not shown in FIGS. 2A and 2B), and the output of RF power amplifier 200 connects to directional coupler 210. In the exemplary implementation depicted in FIG. 2A, coupler 210 is connected in a "reverse" configuration with the output port (instead of the input port) of coupler 210 connected to the output of power amplifier 200 and the input port (instead of the output port) of coupler 210 connected to switch 220. Directional coupler 210 may further include a "coupled" port and an "isolated" port. The coupled port of coupler 210 connects to the RF power measurement unit 230, and the isolated port of coupler 210 connects to a termination 240. The coupled port of coupler 210 supplies a portion of the RF power received via the input of the coupler 210 (power input to the right side of coupler 210 in FIG. 2A) to RF power measurement unit 230. The isolated port of coupler 210 supplies a portion of the RF power received via the output of the coupler 210 (power input to the left side of coupler 210 in FIG. 2A) to termination 240. RF power measurement unit 230 includes circuitry that measures a power level of RF power received via the coupled port of coupler 210. Termination 240 may include a load (e.g., a matched load) connected to the isolated port of coupler 210. The switch to ground 220 may, in the implementation shown, include a SPST switch that connects between the input port of coupler 210 and ground. One side of the switch 220 additionally connects to RF connector 150. In one implementation, switch 220 may include solid-state circuitry for implementing a switching mechanism that selectively either: 1) closes to connect the input of coupler 210 (i.e., the transmitter output) to RF ground; or 2) opens to connect the input of coupler 210 (i.e., the transmitter output) to RF connector terminal 150 (and to an antenna 140 if one is connected to RF connector terminal 150).

In a first mode of operation, shown in FIG. 2A, RF power from the transmitter Tx (not shown) is amplified by power amplifier 200 and supplied to the output port of coupler 210. The RF power transits the main line (illustrated as a solid bold line in FIG. 2A) in coupler 210 to exit the input port of coupler 210. In this first mode of operation, switch 220 is in an open position such that the RF power exiting the input port of coupler 210 transits to RF connector 150, and onward to antenna 140 if antenna 140 is connected to RF connector 150. If antenna 140 is connected to RF connector 150, upon receipt of the RF power that transited coupler 210, a portion of the received RF power reflects from the antenna 140 and transits in a reverse direction through RF connector 150 and switch 220 and back through the input port of coupler 210. The reflected RF power (shown via a bold dashed line in FIG. 2A) received at the input port of coupler 210 exits the coupled port of coupler 210 and may be measured by RF power measurement unit 230 as an amount of RF power reflected ("reflected power" $P_{Ref}$) from the connected antenna 140, or from the RF connector 150 itself if no antenna 140 is connected. The amount of RF power reflected by the antenna 140, when connected to RF connector 150, is related to the SWR and reflection coefficient of the antenna 140.

If an antenna 140 is not connected to RF connector 150 (i.e., RF connector 150 is "open"), upon receipt of the RF power that transited coupler 210, substantially all of the received RF power reflects from the antenna connector 150 and transits in a reverse direction from RF connector 150 back through the input port of coupler 210. A known portion of the reflected RF power received at the input port of coupler 210 exits the coupled port of coupler 210 and may be measured by RF power measurement unit 230. A significant difference in reflected power may be measured at RF power measurement unit 230 between a circumstance when antenna 140 is connected to RF connector 150 and a circumstance when antenna 140 is not connected to RF connector 150. Typically, the reflected power when antenna 140 is connected to RF connector 150 will be significantly lower than the reflected power when an antenna 140 is not connected to RF connector 150.

In a second mode of operation, shown in FIG. 2B, switch 220 is closed such that the input port of coupler 210 is shorted to RF ground (i.e., effectively shorting the amplified transmitter output to ground) to create a transmission path discontinuity at switch 220. In this mode of operation, the RF power from the transmitter Tx (not shown) is amplified by power amplifier 200, supplied to the output port of coupler 210, and then transits the main line (shown via a bold solid line in FIG. 2B) in coupler 210 to exit the input port of coupler 210. After exiting the input port of coupler 210, and encountering the transmission path discontinuity caused by the RF short to ground of switch 220, substantially all of the RF power reflects from the discontinuity and transits in a reverse direction back through the input port of coupler 210 (shown via a bold dashed line in FIG. 2B). The coupler 210 directs a portion of the reflected RF power (shown via a bold dashed line in FIG. 2B) received at the input port to the coupled port of coupler 210 for measurement by RF power measurement unit 230 as an amount of forward power transmitted by the transmitter Tx ("forward power").

Subsequent to measurement of the RF reflected power ($P_{Ref}$), with switch 220 in an open position, and the RF forward power ($P_{For}$), with switch 220 in a closed position, controller 170 (not shown in FIGS. 2A and 2B), may analyze the power measurements to determine whether an antenna 140 is connected to RF connector 150. In one implementation, controller 170 may compare the forward power $P_{For}$ with the reflected power $P_{Ref}$ to determine if the reflected power $P_{Ref}$ is within a threshold value T of the forward power (e.g., $P_{For}-P_{Ref}<T$). A high reflected power $P_{Ref}$ that is within a certain proximity to a value of the forward power $P_{For}$, may indicate that no antenna 140 is connected to RF connector 150. A low reflected power $P_{Ref}$ relative to the forward power $P_{For}$, may, however, indicate that an antenna 140 is connected to RF connector 150.

Figure 3A:
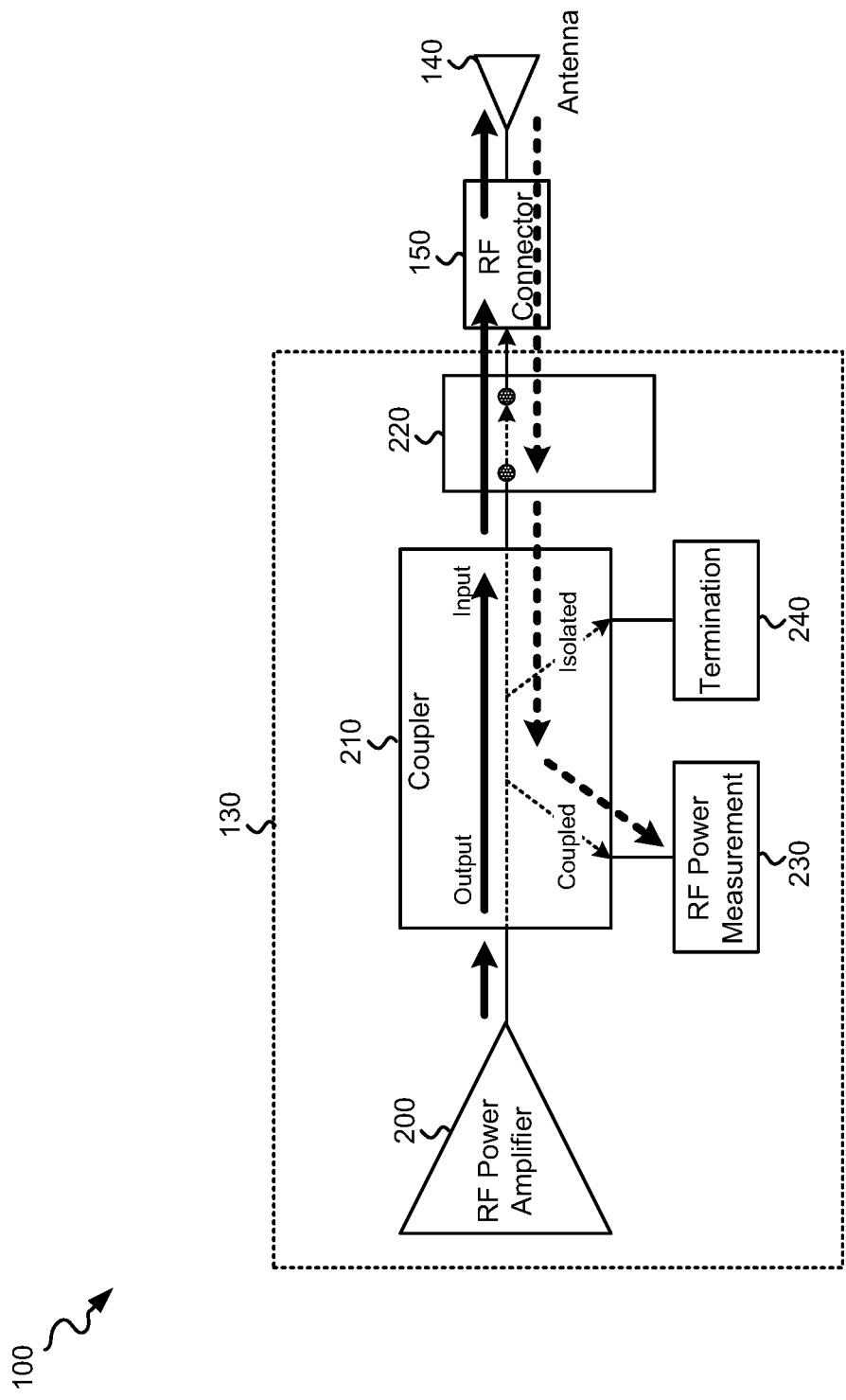
FIGS. 3A and 3B illustrate the detection of the presence or absence of an external antenna, based on return loss measurements, in an exemplary implementation in which a switch causes a transmission discontinuity by selectively creating an open connection between the transmitter RF output and the RF antenna connector terminal.
Figure 3B:
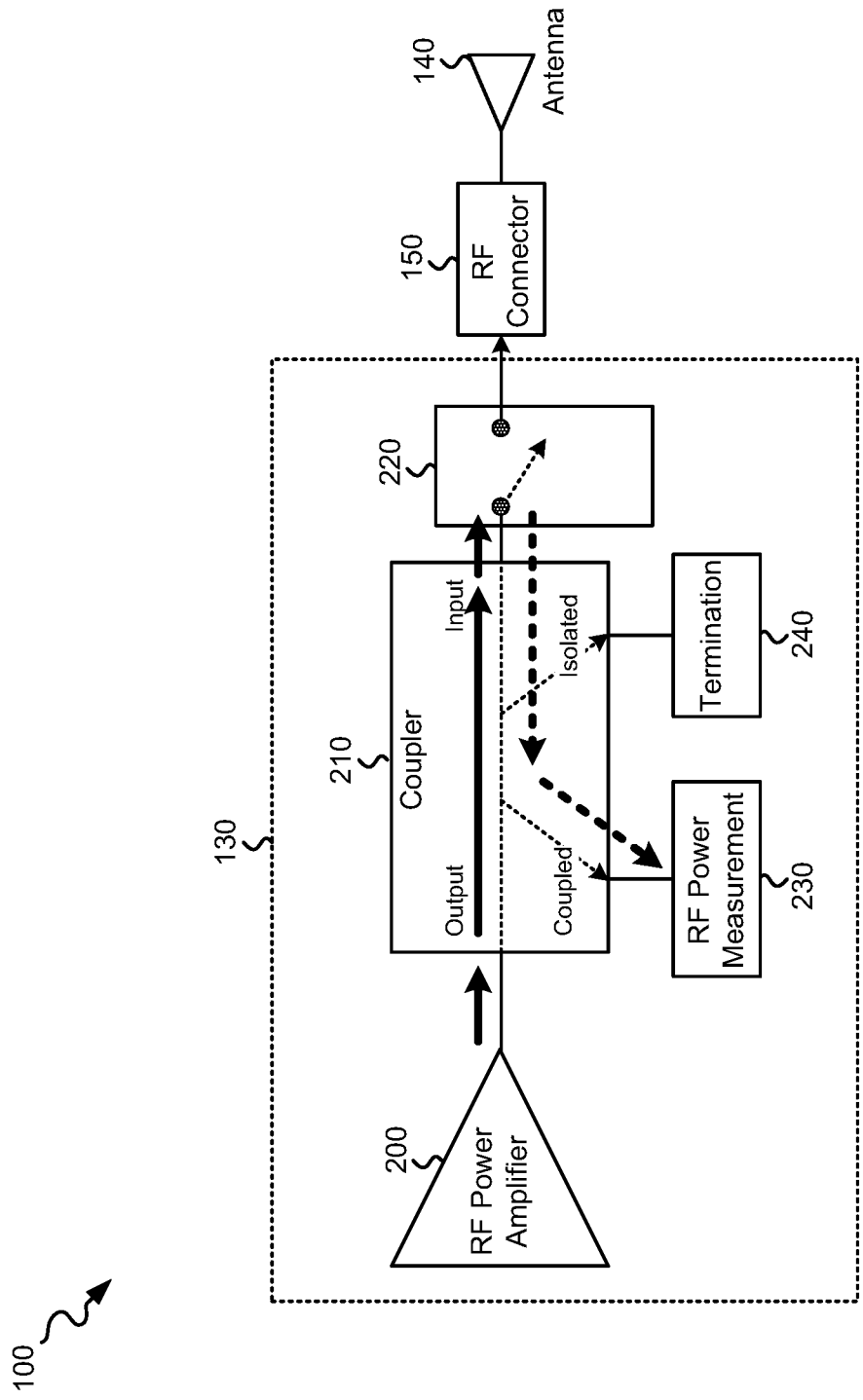

FIGS. 3A and 3B illustrate an overview of the detection of the presence or absence of an external antenna 140 at wireless device 100, based on return loss measurements, in an exemplary implementation in which a switch causes a transmission discontinuity by selectively creating an open connection between the RF output from the transmitter Tx and the RF antenna connector terminal 105. As shown in FIG. 3A, FEM 130 of wireless device 100 may include similar components to those shown in FIGS. 2A and 2B, but with switch 220 connected, and used, differently to create a transmission path discontinuity than described above with respect to the implementation of FIGS. 2A and 2B.

Though not shown in FIGS. 3A and 3B, the output of transmitter Tx of RF transceiver 110 connects to the input of RF power amplifier (PA) 200 via switch 120 (not shown). The output of RF power amplifier 200 further connects to directional coupler 210. In the exemplary implementation depicted in FIG. 3A, coupler 210 is connected in a "reverse" configuration, similar to the configuration described above with respect to FIGS. 2A and 2B, with the output port (instead of the input port) of coupler 210 connected to the output of power amplifier 200 and the input port (instead of the output port) of coupler 210 connected to switch 220. Switch 220 may, in the implementation shown, include a SPST switch that selectively creates an open connection between the input port of coupler 210 and RF antenna connector terminal 150. In one implementation, switch 220 may include solid-state circuitry for implementing a switching mechanism that selectively either: 1) closes to connect the input of coupler 210 (i.e., the transmitter output) to RF connector terminal 150; or 2) opens to create a transmission path discontinuity between the input of coupler 210 (i.e., the transmitter output) and RF connector terminal 150 (and antenna 140 if one is connected to RF connector terminal 150).

In a first mode of operation, shown in FIG. 3A, RF power from the transmitter Tx (not shown) is amplified by power amplifier 200 and supplied to the output port of coupler 210. The RF power transits the main line (illustrated as a solid bold line in FIG. 3A) in coupler 210 to exit the input port of coupler 210. In this first mode of operation, switch 220 is in a closed position such that the RF power exiting the input port of coupler 210 transits to RF connector 150, and onward to antenna 140 if antenna 140 is connected to RF connector 150. If antenna 140 is connected to RF connector 150, upon receipt of the RF power that transited coupler 210, a portion of the received RF power reflects from the antenna 140 and transits in a reverse direction through RF connector 150 and switch 220 and back through the input port of coupler 210. A known portion of the reflected RF power (shown via a bold dashed line in FIG. 3A) received at the input port of coupler 210 exits the coupled port of coupler 210 and may be measured by RF power measurement unit 230 as an amount of RF power reflected ("reflected power" $P_{Ref}$) from the connected antenna 140, or from the RF connector 150 itself if no antenna 140 is connected. The amount of RF power reflected by the antenna 140, when connected to RF connector 150, is related to the SWR and reflection coefficient of the antenna 140.

If an antenna 140 is not connected to RF connector 150 (i.e., RF connector 150 is "open"), upon receipt of the RF power that transited coupler 210, substantially all of the received RF power reflects from the antenna connector 150 and transits in a reverse direction from RF connector 150 back through the input port of coupler 210. A known portion of the reflected RF power received at the input port of coupler 210 exits the coupled port of coupler 210 and may be measured by RF power measurement unit 230. A significant difference in reflected power may be measured at RF power measurement unit 230 between a circumstance when antenna 140 is connected to RF connector 150 and a circumstance when antenna 140 is not connected to RF connector 150. Typically, the reflected power when antenna 140 is connected to RF connector 150 will be significantly lower than the reflected power when an antenna 140 is not connected to RF connector 150.

In a second mode of operation, shown in FIG. 3B, switch 220 is open such that a transmission discontinuity is created between the input port of coupler 210 and RF connector terminal 150. In this mode of operation, the RF power from the transmitter Tx (not shown) is amplified by power amplifier 200, supplied to the output port of coupler 210, and then transits the main line (shown via a bold solid line in FIG. 3B) in coupler 210 to exit the input port of coupler 210. After exiting the input port of coupler 210, and encountering the transmission discontinuity created by the open switch 220, substantially all of the RF power reflects from the discontinuity and transits in a reverse direction back through the input port of coupler 210 (shown via a bold dashed line in FIG. 3B). The coupler 210 directs a known portion of the reflected RF power (shown via a bold dashed line in FIG. 3B) received at the input port to the coupled port of coupler 210 for measurement by RF power measurement unit 230 as an amount of forward power $P_{For}$ transmitted by the transmitter Tx.

Subsequent to measurement of the RF reflected power ($P_{Ref}$), with switch 220 in a closed position, and the RF forward power ($P_{For}$), with switch 220 in an open position, controller 170 (not shown in FIGS. 3A and 3B), may analyze the power measurements to determine whether an antenna 140 is connected to RF connector 150. In one implementation, controller 170 may compare the forward power $P_{For}$ with the reflected power $P_{Ref}$ to determine if the reflected power $P_{Ref}$ is within a threshold value T of the forward power (e.g., $P_{For}-P_{Ref}<T$). A high reflected power $P_{Ref}$ that is within a certain proximity to a value of the forward power $P_{For}$, may indicate that no antenna 140 is connected to RF connector 150. A low reflected power $P_{Ref}$ relative to the forward power $P_{For}$, may, however, indicate that an antenna 140 is connected to RF connector 150.

Figure 4A:
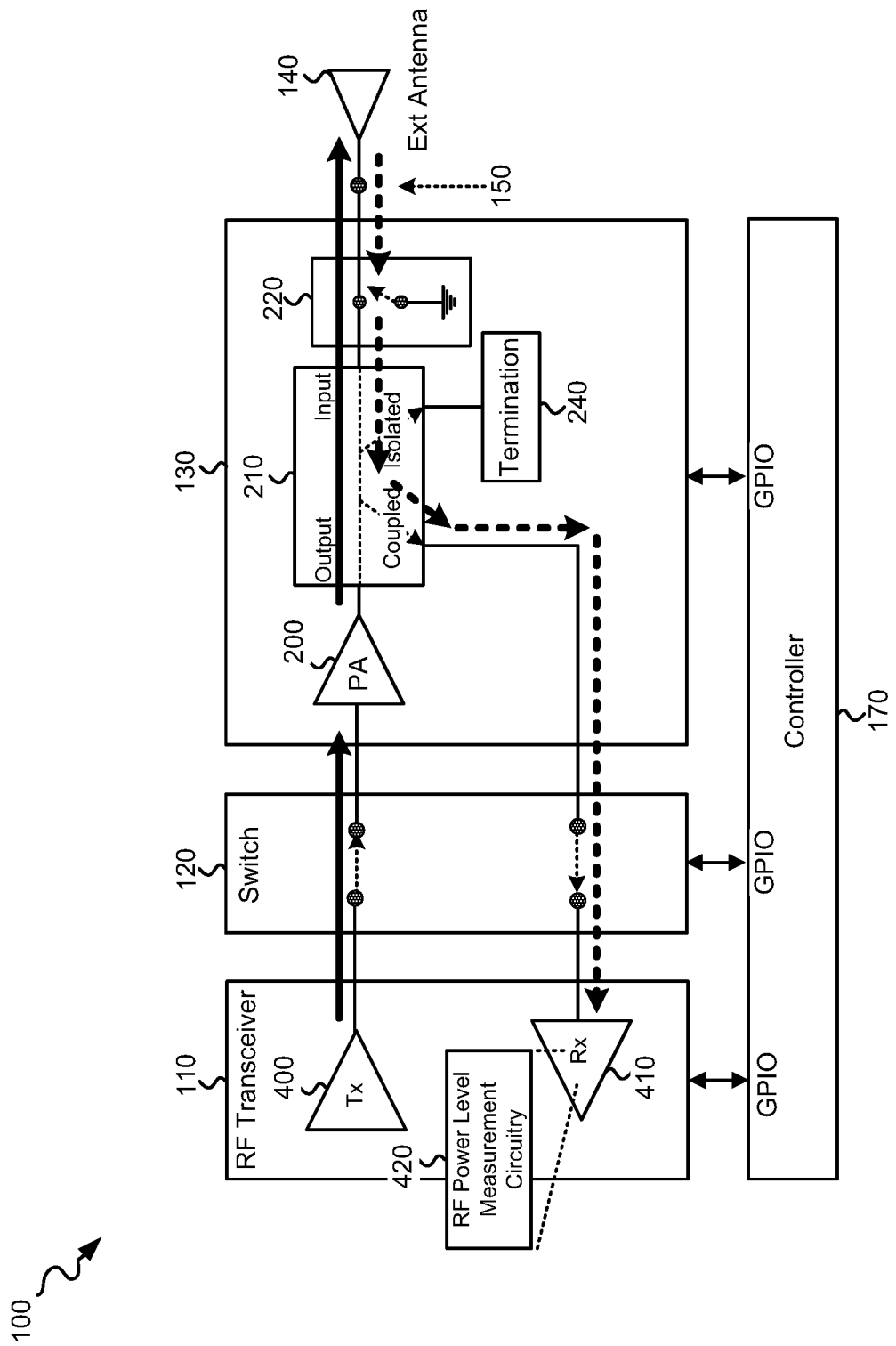
FIGS. 4A and 4B illustrate a further exemplary implementation in which the RF power measurements are performed by RF power level measurement circuitry of the receiver of the RF transceiver of the wireless device of FIG. 1.
Figure 4B:
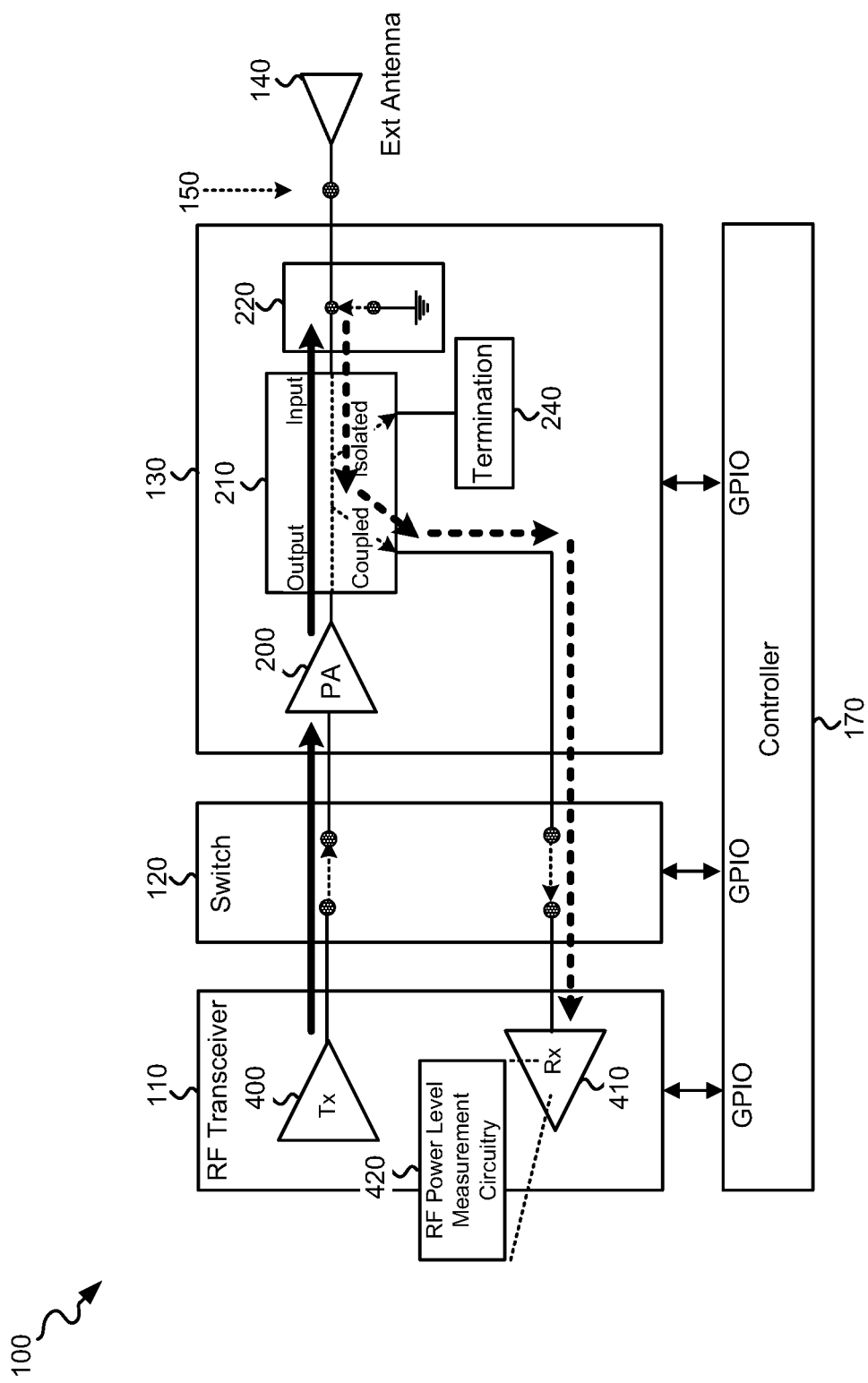

FIGS. 4A and 4B illustrate a further exemplary implementation in which the RF power measurements are performed by RF power level measurement circuitry of the receiver Rx of the RF transceiver 110 of wireless device 100. As shown in FIG. 4A, RF transceiver 110 includes a transmitter Tx 400 and a receiver Rx 410. An RF output of transmitter Tx 400 connects to the power amplifier 200 of FEM 130 via switch 120, and an RF input of receiver Rx 410 connects (possibly via a switch of FEM 130 not shown in FIG. 3A) to the coupled port of directional coupler 210.

In a first mode of operation, shown in FIG. 4A, RF power from the transmitter Tx 400 is amplified by power amplifier 200 and supplied to the output port of coupler 210. The RF power transits the main line (shown via a bold line in FIG. 4A) in coupler 210 to exit the input port of coupler 210. In this first mode of operation, switch 220 is in an open position such that the RF power exiting the input port of coupler 210 transits to RF connector 150, and onward to antenna 140 if antenna 140 is connected to RF connector 150. If antenna 140 is connected to RF connector 150, upon receipt of the RF power that transited coupler 210, a portion of the received RF power reflects from the antenna 140 and transits in a reverse direction through RF connector 150 and switch 220 and back through the input port of coupler 210. A known portion of the reflected RF power received at the input port of coupler 210 exits the coupled port of coupler 210 (shown with a bold dashed line in FIG. 4A) and may be measured by RF power level measurement circuitry 420 of receiver Rx 410 as an amount of RF power reflected ("reflected power" $P_{Ref}$) from any connected antenna 140, or from the RF connector 150 itself if no antenna 140 is connected. RF power level measurement circuitry 420 measures a power level associated with RF signals received at the input to the receiver Rx 410. In one implementation, the RF power level measurement circuitry 420 includes Receive Signal Strength Indication (RSSI) circuitry of the receiver Rx 410. The RSSI circuitry measures and calculates a value that represents a power level (e.g., in dBm) of input RF signals.

If antenna 140 is not connected to RF connector 150 (i.e., RF connector 150 is "open"), upon receipt of the RF power that transited coupler 210, substantially all of the received RF power reflects from the antenna connector 150 and transits in a reverse direction from RF connector 150 back through the input port of coupler 210. The reflected RF power ($P_{Ref}$) received at the input port of coupler 210 exits the coupled port of coupler 210 and may be measured by RF power level measurement circuitry 420 of RF transceiver 110. As described above with respect to FIGS. 2A and 2B, a significant difference in reflected power may be measured between a circumstance when antenna 140 is connected to RF connector 150 and a circumstance when antenna 140 is not connected to RF connector 150.

In a second mode of operation, shown in FIG. 4B, switch 220 is closed such that the input port of coupler 210 is shorted to RF ground to create a transmission path discontinuity. In this mode of operation, the RF power from the transmitter Tx 400 is amplified by power amplifier 200, supplied to the output port of coupler 210, and then transits the main line (shown via a bold solid line in FIG. 4B) in coupler 210 to exit the input port of coupler 210. After exiting the input port of coupler 210, and encountering the discontinuity caused by the short to ground of switch 220, substantially all of the RF power reflects from the discontinuity and transits in a reverse direction back through the input port of coupler 210. The coupler 210 directs the reflected RF power (shown via a bold, dashed line in FIG. 4B) received at the input port to the coupled port of coupler 210 for measurement by RF power level measurement circuitry 420 as an amount of forward power ($P_{For}$) transmitted by the transmitter Tx 400.

Subsequent to measurement of the RF reflected power $P_{Ref}$, with switch 220 in an open position, and the RF forward power $P_{For}$, with switch 220 in a closed position, controller 170, may analyze the power measurements, received from RF power level measurement circuitry 420, to determine whether an antenna 140 is connected to RF connector 150. In one implementation, controller 170 may compare the RF forward power with the RF reflected power to determine if the RF reflected power is within a threshold value T of the RF forward power (e.g., $P_{For}-P_{Ref}<T$). A high RF reflected power, that is within a certain proximity to a value of the RF forward power, may indicate that no antenna 140 is connected to RF connector 150. A low RF reflected power, relative to the RF forward power, may, however, indicate that an antenna 140 is connected to RF connector 150.

Alternatively, in the second mode of operation depicted in FIG. 4B, switch 220, as shown, may be replaced with the switch 220 shown in FIG. 3B. In this alternative implementation, a transmission discontinuity may be generated between coupler 210 and RF connector terminal 150 by opening the switch 220 and creating an open connection, as opposed to closing switch 220 (shown in FIG. 3B) and creating a short between input port of coupler 210 and ground.

Figure 5A:
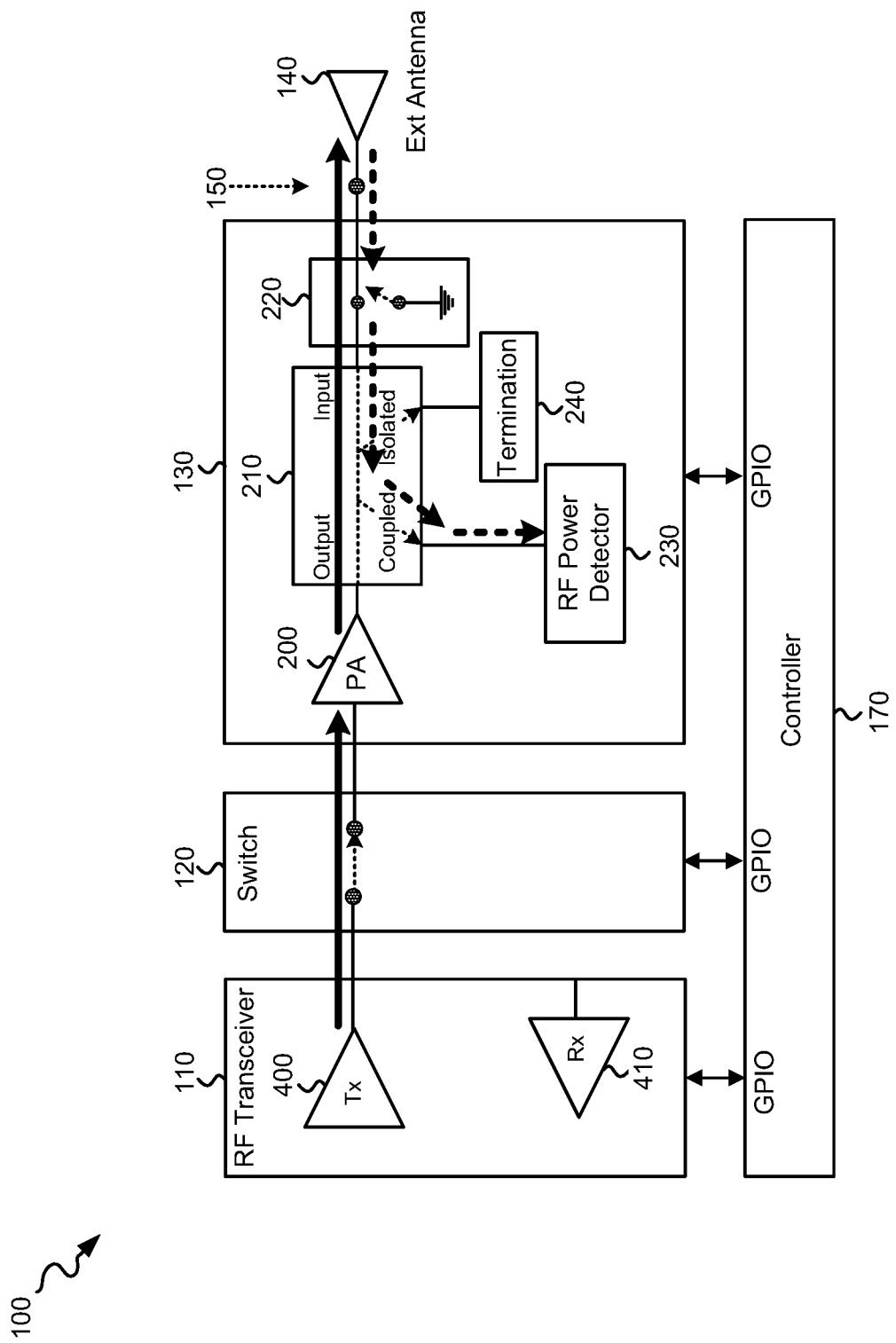
FIGS. 5A and 5B illustrate an exemplary implementation in which RF power measurements are performed by RF power detector circuitry of the front-end module of the wireless device of FIG. 1.
Figure 5B:
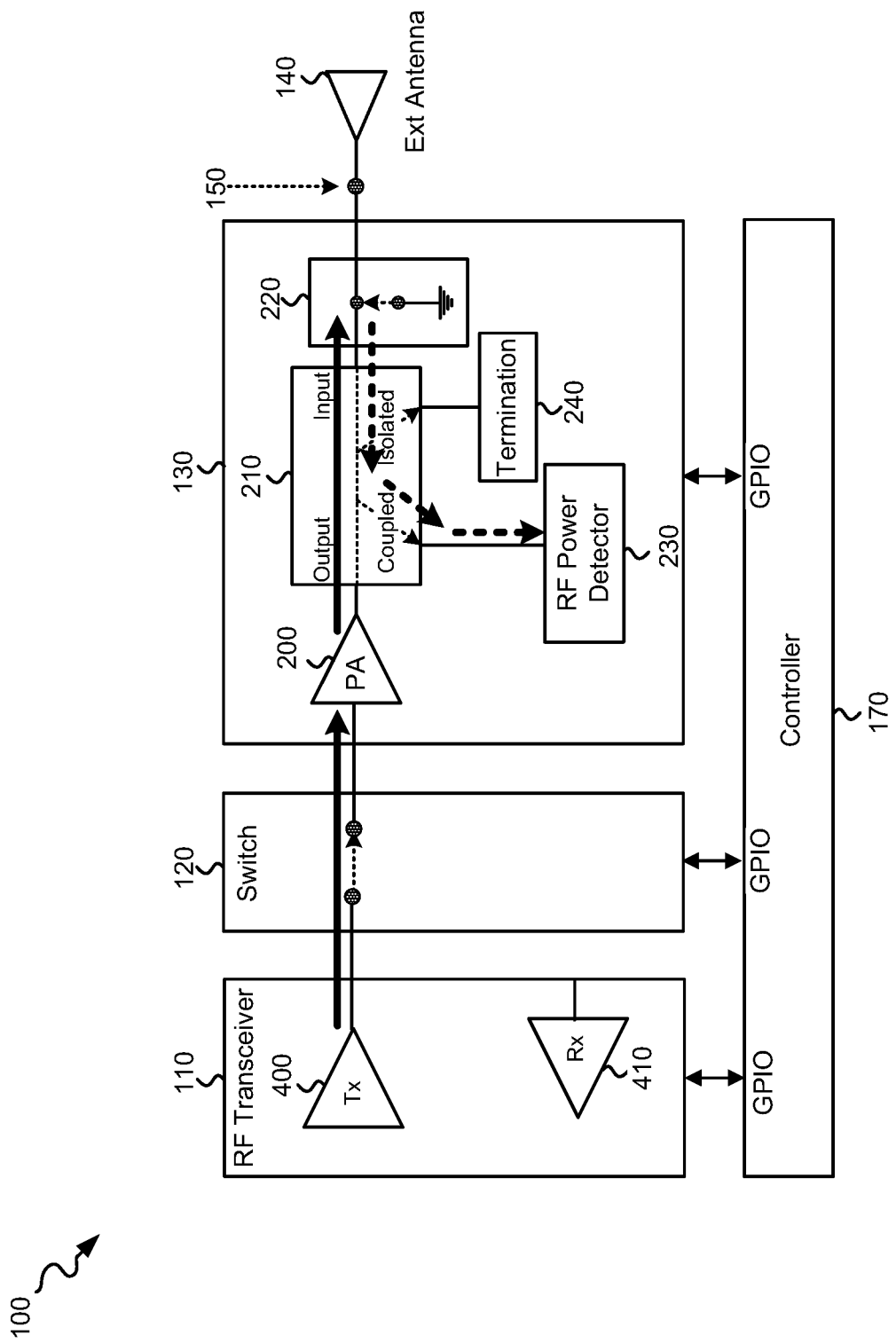

FIGS. 5A and 5B illustrate an exemplary implementation in which RF power measurements are performed by RF power detector circuitry of FEM 130 of wireless device 100. In this implementation, in a first mode of operation shown in FIG. 5A, RF power from the transmitter Tx 400 is amplified by power amplifier 200 and supplied to the output port of coupler 210. The RF power transits the main line (shown via a bold solid line in FIG. 5A) in coupler 210 to exit the input port of coupler 210. In this first mode of operation, switch 220 is in an open position such that the RF power exiting the input port of coupler 210 transits to RF connector 150, and onward to antenna 140 if antenna 140 is connected to RF connector 150. If antenna 140 is connected to RF connector 150, upon receipt of the RF power that transited coupler 210, a portion of the received RF power reflects from the antenna 140 and transits in a reverse direction through RF connector 150 and back through the input port of coupler 210. The reflected RF power (shown via a bold dashed line in FIG. 6A) received at the input port of coupler 210 and may be measured by RF power detector 230 of FEM 130 as an amount of RF power reflected ("reflected power" $P_{Ref}$) from the connected antenna 140, or from the RF connector 150 itself if no antenna 140 is connected. RF power detector 230 measures a power level associated with RF signals received via the coupled port of directional coupler 210 and converts the measured power level to a corresponding Direct Current (DC) voltage level. Controller 170 receives the DC voltage level, that equates to the level of the reflected RF power detected by RF power detector 230.

If antenna 140 is not connected to RF connector 150 (i.e., RF connector 150 appears as an "open" circuit), upon receipt of the RF power that transited coupler 210, substantially all of the received RF power reflects from the RF connector 150 and transits in a reverse direction from RF connector 150 back through the input port of coupler 210. The reflected RF power ($P_{Ref}$) received at the input port of coupler 210 exits the coupled port of coupler 210 and may be measured by RF power detector 230 of FEM 130.

In a second mode of operation, shown in FIG. 5B, switch 220 is closed such that the input port of coupler 210 is shorted to RF ground to create a transmission path discontinuity. In this mode of operation, the RF power from the transmitter Tx 400 is amplified by power amplifier 200, supplied to the output port of coupler 210, and then transits the main line (shown via a bold solid line in FIG. 5B) in coupler 210 to exit the input port of coupler 210. After exiting the input port of coupler 210, and encountering the discontinuity created by the short to ground of switch 220, substantially all of the RF power reflects from the short to ground and transits in a reverse direction back through the input port of coupler 210. The coupler 210 directs the reflected RF power (shown via a bold dashed line in FIG. 5B) received at the input port to the coupled port of coupler 210 for measurement by RF power detector 230 as an amount of forward power ($P_{For}$) transmitted by the transmitter Tx 400.

Subsequent to measurement of the RF reflected power $P_{Ref}$, with switch 220 in an open position, and the RF forward power $P_{For}$, with switch 220 in a closed position, controller 170, may analyze the power measurements, received from RF power detector 230, to determine whether an antenna 140 is connected to RF connector 150. In one implementation, controller 170 may compare the RF forward power with the RF reflected power to determine if the RF reflected power is within a threshold value T of the RF forward power (e.g., $P_{For}-P_{Ref}<T$). A high RF reflected power, that is within a certain proximity to a value of the RF forward power, may indicate that no antenna 140 is connected to RF connector 150. A low RF reflected power, relative to the RF forward power, may, however, indicate that an antenna 140 is connected to RF connector 150.

Alternatively, in the second mode of operation depicted in FIG. 5B, switch 220, as shown, may be replaced with the switch 220 shown in FIG. 3B. In this alternative implementation, a transmission path discontinuity may be generated between coupler 210 and RF connector terminal 150 by opening the switch 220 and creating an open connection, as opposed to closing switch 220 (shown in FIG. 3B) and creating a RF short between input port of coupler 210 and ground.

Figure 6A:
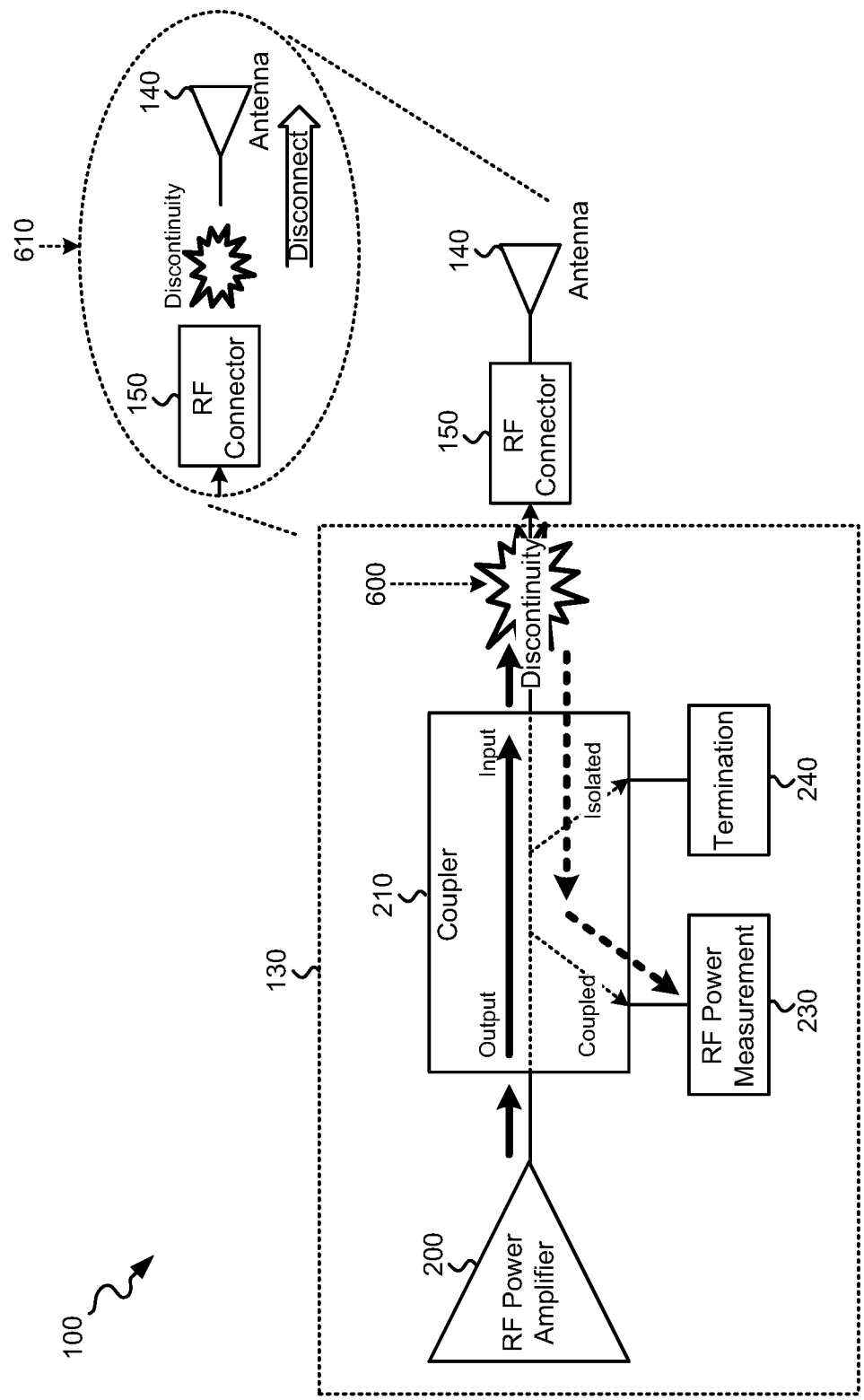
FIGS. 6A and 6B illustrate the detection of the presence or absence of an external antenna at a wireless device, based on return loss measurements, in another exemplary implementation in which the RF forward power is pre-measured and stored at the wireless device for subsequent return loss determinations.
Figure 6B:
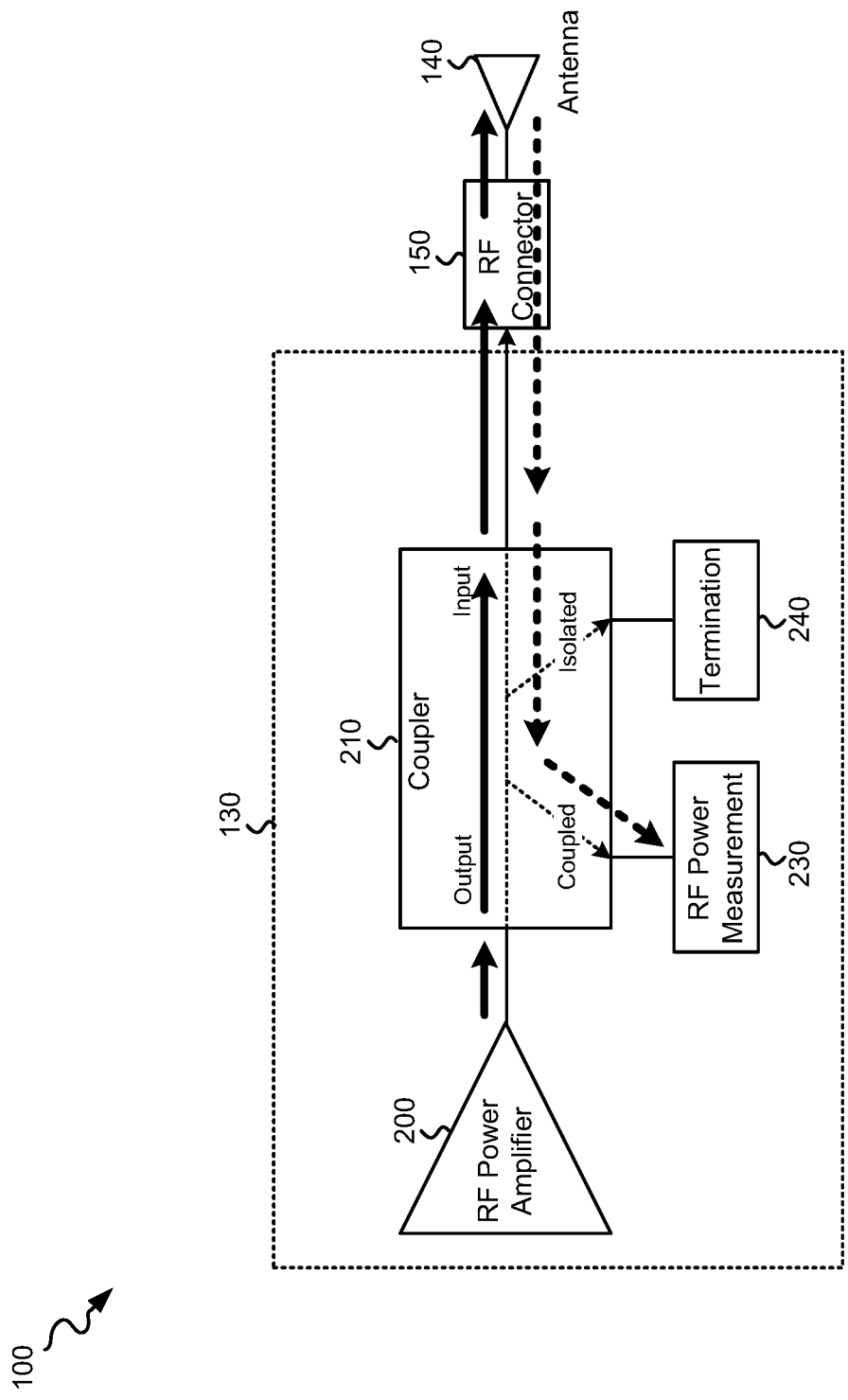

FIGS. 6A and 6B illustrate an overview of the detection of the presence or absence of an external antenna 140 at wireless device 100, based on return loss measurements, in another exemplary implementation in which the RF forward power $P_{For}$ is pre-measured and stored at wireless device 100 for subsequent return loss determinations. Thus, in this implementation, an initial RF reflected power $P_{Ref}$ measurement is performed (e.g., at the factory during the process of manufacturing wireless device 100), and the return loss may later be determined (e.g., during operation of wireless device 100) based on a contemporaneously measured $P_{Ref}$ and the previously measured and stored RF forward power $P_{For}$ value.

As shown in FIG. 6A, FEM 130 of wireless device 100 may include similar components to those shown in FIGS. 2A and 2B, but with switch 220 omitted. In a first phase, shown in FIG. 6A, a discontinuity 600 can be created in the path between the input of coupler 210 and RF connector terminal 150 (e.g., at, or near, RF connector terminal 150). In one example, shown at 610, the discontinuity may be created by disconnecting external antenna 140 from RF connector terminal 150 so as to create an "open" transmission path at the input of the coupler 210. Once the discontinuity is created, the RF forward power $P_{For}$ may be measured and then stored in memory at wireless device 100. The first phase, shown in FIG. 6A, may, for example, be performed during the process of manufacturing wireless device 100 (e.g., at the factory).

RF power from the transmitter Tx (not shown) is amplified by power amplifier 200 and supplied to the output port of coupler 210. The RF power transits the main line (illustrated as a solid bold line in FIG. 6A) in coupler 210 to exit the input port of coupler 210. With a discontinuity created at RF connector terminal 150, substantially all of the RF power that transited coupler 210, reflects from the discontinuity and transits in a reverse direction from RF connector 150 back through the input port of coupler 210 (shown with a bold dashed line in FIG. 6A). The reflected RF power received at the input port of coupler 210, corresponding to the RF forward power $P_{For}$, exits the coupled port of coupler 210 and may be measured by RF power measurement unit 230. The measured RF forward power $P_{For}$ may then be stored in memory storage at wireless device 100 for subsequent use in return loss determinations.

Subsequently, during operation of wireless device 100, a measurement of reflected power $P_{Ref}$ may be made to determine a return loss that can be used, in conjunction with the stored RF forward power $P_{For}$, to determine whether an external antenna 140 is connected to RF connector terminal 150. During this second phase, if external antenna 140 is connected to RF connector terminal 150 and, therefore, no discontinuity exists at, or near, RF connector terminal 150, then RF power exiting the input port of coupler 210 transits to RF connector 150, and onward to antenna 140. Upon receipt of the RF power that transited coupler 210, at antenna 140, a portion of the received RF power reflects from the antenna 140 and transits in a reverse direction through RF connector 150 and back through the input port of coupler 210. The reflected RF power (shown via a bold, dashed line in FIG. 6B) received at the input port of coupler 210 exits the coupled port of coupler 210 and may be measured by RF power measurement unit 230 as an amount of RF power reflected $P_{Ref}$ from the connected antenna 140, or from the RF connector 150 itself if no antenna 140 is connected. The amount of RF power reflected by the antenna 140, when connected to RF connector 150, is related to the SWR and reflection coefficient of the antenna 140.

If an antenna 140 is not connected to RF connector 150 (i.e., RF connector 150 is "open"), upon receipt of the RF power that transited coupler 210, substantially all of the received RF power reflects from the antenna connector 150 and transits in a reverse direction from RF connector 150 back through the input port of coupler 210. The reflected RF power received at the input port of coupler 210 exits the coupled port of coupler 210 and may be measured by RF power measurement unit 230. A significant difference in reflected power $P_{Ref}$ may be measured at RF power measurement unit 230 between a circumstance when antenna 140 is connected to RF connector 150 and a circumstance when antenna 140 is not connected to RF connector 150. Typically, the reflected power $P_{Ref}$ when antenna 140 is connected to RF connector 150 will be significantly lower than the reflected power when an antenna 140 is not connected to RF connector 150.

Subsequent to measurement of the RF reflected power ($P_{Ref}$), controller 170 (not shown in FIGS. 6A and 6B), may analyze the power measurements (i.e., previously measured and stored $P_{For}$, and currently measured $P_{Ref}$) to determine whether an antenna 140 is connected to RF connector 150. In one implementation, controller 170 may retrieve the stored forward power measurement $P_{For}$ from memory and compare $P_{For}$ with the reflected power $P_{Ref}$ to determine if the reflected power $P_{Ref}$ is within a threshold value T of the forward power (e.g., $P_{For}$-$P_{Ref}$<T). A high reflected power $P_{Ref}$, that is within a certain proximity to a value of the forward power $P_{For}$, may indicate that no antenna 140 is connected to RF connector 150. A low reflected power $P_{Ref}$, relative to the forward power $P_{For}$, may, however, indicate that an antenna 140 is connected to RF connector 150.

Figure 7A:
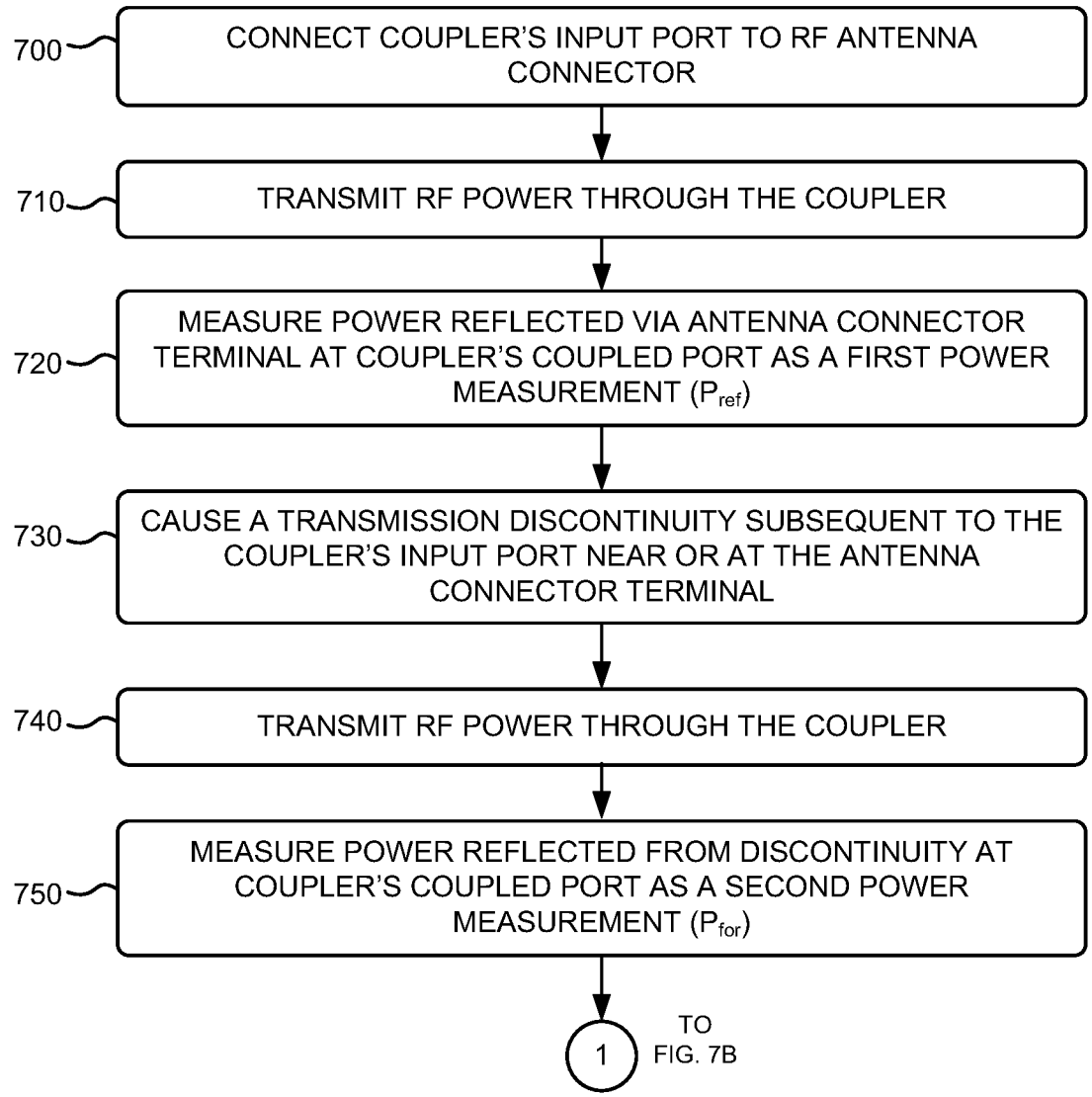
FIGS. 7A and 7B illustrate an exemplary process for detecting whether an antenna is connected to the antenna connector terminal of the wireless device of FIG. 1 based on return loss measurements.
Figure 7B:
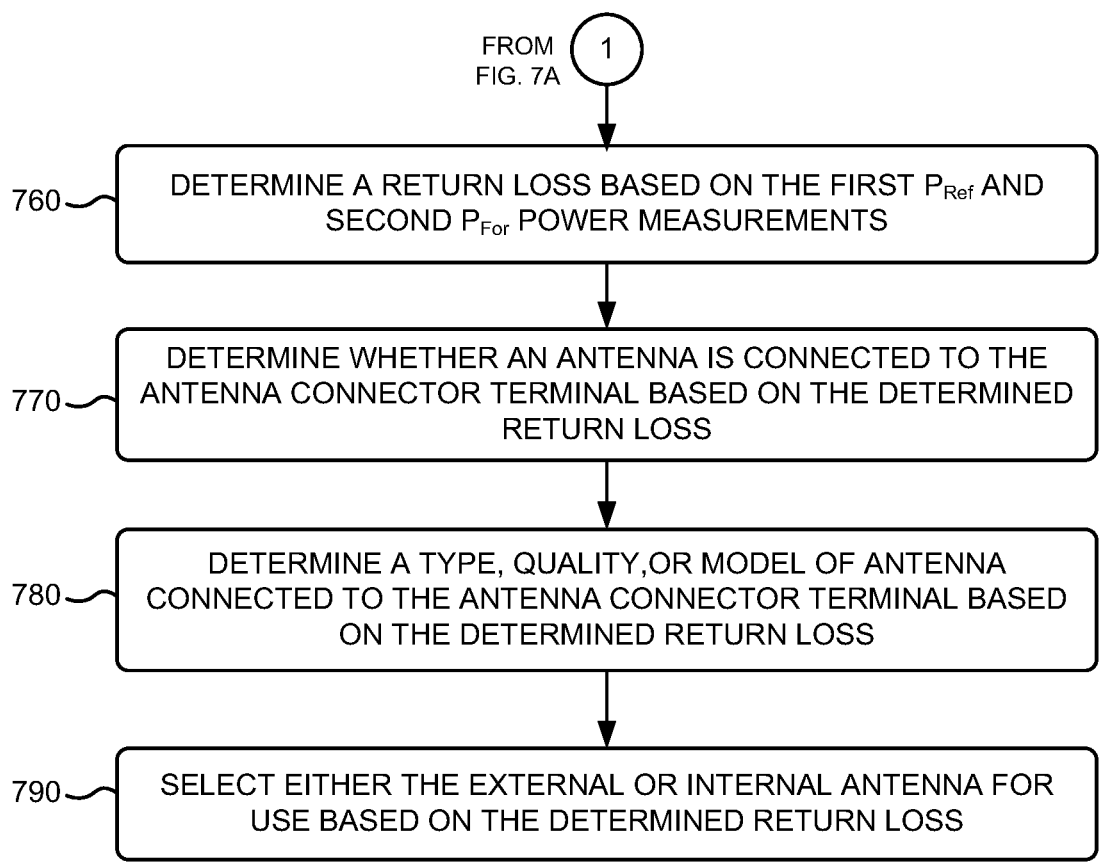

FIGS. 7A and 7B illustrate an exemplary process for detecting whether an antenna 140 is connected to the antenna connector terminal 150 of a wireless device 100 based on return loss measurements. The exemplary process of FIGS. 7A and 7B may, in some implementations, be implemented by the components of wireless device 100. In other implementations, the exemplary process of FIGS. 7A and 7B may be implemented by the components of wireless device 100 in conjunction with at least one external device or module. In further implementations, certain blocks of the process of FIGS. 7A and 7B may be performed manually.

The exemplary process includes controller 170 issuing an instruction to FEM 130 to connect coupler 210's input port to RF antenna connector 150 (block 700). In the implementation of FIGS. 2A and 2B, controller 170 issues an instruction to FEM 130 to cause switch 220 to create an open across the switch 220 to ground. In this implementation, opening of switch 220, which connects to coupler 210's input port, results in coupler 210 (i.e., the transmitter output) being connected through to antenna connector terminal 150. In the implementation of FIGS. 3A and 3B, controller issues an instruction to FEM 130 to cause switch 220 to close to connect the input port of coupler 210 to RF antenna connector 150.

Controller 170 issues an instruction to cause transmitter Tx 400 of RF transceiver 110 to transmit power through coupler 210 (block 710). Upon receipt of the instruction from controller 170, transmitter Tx 400 generates RF power and transmits the RF power through switch 120 for amplification by power amplifier 200 of FEM 130. Power amplifier 200 transmits the amplified RF power through coupler 210 (output port to input port) to exit coupler 210's input port and proceed to any connected antenna 140 via RF antenna connector terminal 150.

Controller 170 issues an instruction to cause the measurement of RF power, reflected via antenna connector terminal 150, at the coupler 210's coupled port as a first power measurement (e.g., reflected power measurement $P_{Ref}$) (block 720). As shown in FIGS. 2A, 3A, 4A, 5A, and 6B, if an antenna 140 is connected to antenna connector terminal 150, a portion of the transmitted RF power reflects from the antenna 140 back through the input port of coupler 210 to the coupled port of coupler 210. For example, in the implementation depicted in FIG. 4A, the reflected power exits the coupled port of coupler 210, proceeds through switch 120 to receiver Rx 410 of RF transceiver 110. RF power level measurement circuitry 420 of receiver Rx 410 measures the RF power level of the reflected power. As another example, in the alternative implementation depicted in FIG. 5A, the reflected power exits the coupled port of coupler 210, and proceeds to RF power detector 230 located within, or coupled to, FEM 130. The RF power detector 230 generates a DC voltage level that corresponds to the power level of the reflected power.

Controller 170 issues an instruction to FEM 130 to cause a transmission path discontinuity subsequent to coupler 210's input port, at or near antenna connector terminal 150 (block 730). For example, in the implementation of FIG. 2B, upon receipt of the instruction from controller 170, switch 220, which previously was in an open state in block 700, closes to connect the coupler 210's input port to ground and create a discontinuity at or near RF antenna connector 150. As another example, in the implementation of FIG. 3B, upon receipt of the instruction from controller 170, switch 220, which was previously in a closed state in block 700, opens to disconnect the coupler 210's input port from RF antenna connector terminal 150 and, thus, create a discontinuity at or near RF antenna connector 150.

Controller 170 issues an instruction to again cause transmitter Tx 400 of RF transceiver 110 to transmit power through coupler 210 (block 740). Upon receipt of the instruction from controller 170, transmitter Tx 400 generates RF power and transmits the RF power through switch 120 for amplification by power amplifier 200 of FEM 130. Power amplifier 200 transmits the amplified RF power through coupler 210 (output port to input port) to exit coupler 210's input port and proceed towards the transmission path discontinuity created in block 730.

Controller 170 issues an instruction to cause the measurement of RF power, reflected from the discontinuity created in block 730, as a second power measurement (e.g., forward power measurement $P_{For}$) (block 750). As shown in FIGS. 2B, 3B, 4B, and 5B, transmitted RF power that exits the input port of coupler 210 encounters the discontinuity caused by switch 220 (e.g., caused by switch 220 closing in FIG. 2B, 4B, or 5B, or switch 220 opening in FIG. 3B). Upon encountering the discontinuity, substantially all of the incident RF power, representing the forward power transmitted by transmitter Tx 400, reflects backwards through the input port of coupler 210 and to the coupled port of coupler 210. For example, in the implementation depicted in FIG. 4B, the reflected power exits the coupled port of coupler 210, proceeds through switch 120 to receiver Rx 410 of RF transceiver 110. RF power level measurement circuitry 420 of receiver Rx 410 measures the RF power level of the reflected power as a second power measurement (i.e., forward power $P_{For}$). As another example, in the alternative implementation depicted in FIG. 5B, the reflected power exits the coupled port of coupler 210, and proceeds to RF power detector 230 located within, or coupled to, FEM 130. The RF power detector 230 generates a DC voltage level that corresponds to the power level of the reflected power.

Controller 170 determines a return loss based on the first ($P_{Ref}$) and second ($P_{For}$) power measurements (block 760) (FIG. 7B). Controller 170 may, for example, determine the return loss (RL) using the following relation:

$$RL=10*\log(P_{For}/P_{Ref}) \qquad \text{Eqn. (1)}$$

Controller 170 determines whether an antenna 140 is connected or coupled to the antenna connector terminal 150 based on the determined return loss (block 770). For example, if the return loss RL is low, then controller 170 may determine that an antenna 140 is not connected or coupled to the connector terminal 150. If the return loss RL is high, then controller 170 may determine that an antenna 140 is connected or coupled to the connector terminal 150. In one implementation, controller 170 may compare the return loss RL with a return loss threshold $RL_{Th}$ to determine whether an antenna is connected to the connector terminal 150. For example, if $RL<RL_{Th}$, then controller 170 may determine that no antenna 140 is connected to the connector terminal 150. As another example, if $RL>RL_{Th}$, then controller 170 may determine that an antenna 140 is connected to the connector terminal 150. In one exemplary implementation, controller 170 may determine that an antenna 140 is not connected to antenna connector terminal 150 if RL is less than or equal to 5 dB, and may further determine that an antenna 140 is connected to antenna connector terminal 150 if RL is greater than or equal to 10 dB. Other values of $RL_{Th}$ may, however, be used. In some implementations, controller 170 may select the use of either external antenna 140 or internal antenna 160 based on the determination of whether external antenna 140 is connected to connector terminal 150. Therefore, in block 770 of the exemplary process of FIGS. 7A and 7B, controller 170 determines that an external antenna 140 has been connected to connector terminal 150, and the controller 170 may then, via switch 120, connect the transmitter Tx, or receiver Rx, of RF transceiver 110 to the external antenna 140 for transmission or reception.

Additionally, or alternatively, controller 170 may determine a type, quality, or model of an antenna 140 connected to the connected terminal 150 based on the determined return loss (block 780). For example, the return loss may be related to the standing wave ratio (SWR) of the connected antenna 140 and, therefore, can be indicative of a quality of the antenna 140. Additionally, different types or models of antennas may have different, but known, return losses and, therefore, the measured return loss RL of the connected antenna 140 may be used as a basis for identifying the type or model of antenna. Controller 170 may, thus, use the return loss determined in block 760 for identifying a type, quality, and/or model of any antenna 140 connected to the connected terminal 150. For example, controller 170 may store a database of return loss values for various types of external antennas and identify the particular antenna based on a lookup, using the determined return loss, into the database. In some circumstances, or certain implementations, block 780 may be omitted from the exemplary process of FIGS. 7A and 7B.

Additionally, or alternatively, controller 170 may select either external antenna 140 or internal antenna 160 for use in transmission and/or reception based on the determined return loss (block 790). For example, controller 170 may select the use of either external antenna 140 or internal antenna 160 based on whether the return loss determination indicates that the external antenna 140 is connected to connector terminal 150. Controller 170 may select the use of either external antenna 140 or internal antenna 160 further based on a determined quality, type, and/or model of the connected external antenna. For example, a particular type of external antenna 140 may have superior transmission/ reception parameters than the internal antenna 160 of wireless device 100. Therefore, in the exemplary process of FIGS. 7A and 7B, controller 170 may determine that the particular type of external antenna 140 has been connected to connector terminal 150, and the controller 170 may then, via switch 120, connect the transmitter Tx, or receiver Rx, of RF transceiver 110 to the external antenna 140 for improved transmission or reception (e.g., better transmission signal quality) relative to using internal antenna 160. In some circumstances, or certain implementations, block 790 may be omitted from the exemplary process of FIGS. 7A and 7B.

The order of the execution of the blocks of the process of FIGS. 7A and 7B may be altered in certain implementations. For example, for the implementation of FIGS. 6A and 6B, in which the forward power $P_{For}$ measurement is pre-measured at, for example, the factory and stored in memory, then blocks 730, 740, and 750 may be executed first, prior to the measurement of reflected power $P_{Ref}$ in blocks 700, 710, and 720. In certain circumstances, the forward power $P_{For}$ measurement (e.g., blocks 730, 740, and 750) of FIG. 6A may be performed manually (e.g., by a factory technician), and the resulting $P_{For}$ measurement may be manually entered into a memory of wireless device 100 for future execution of blocks 700, 710, 720, 760, and 770 of FIGS. 7A and 7B during operation of wireless device 100.

Figure 8A:
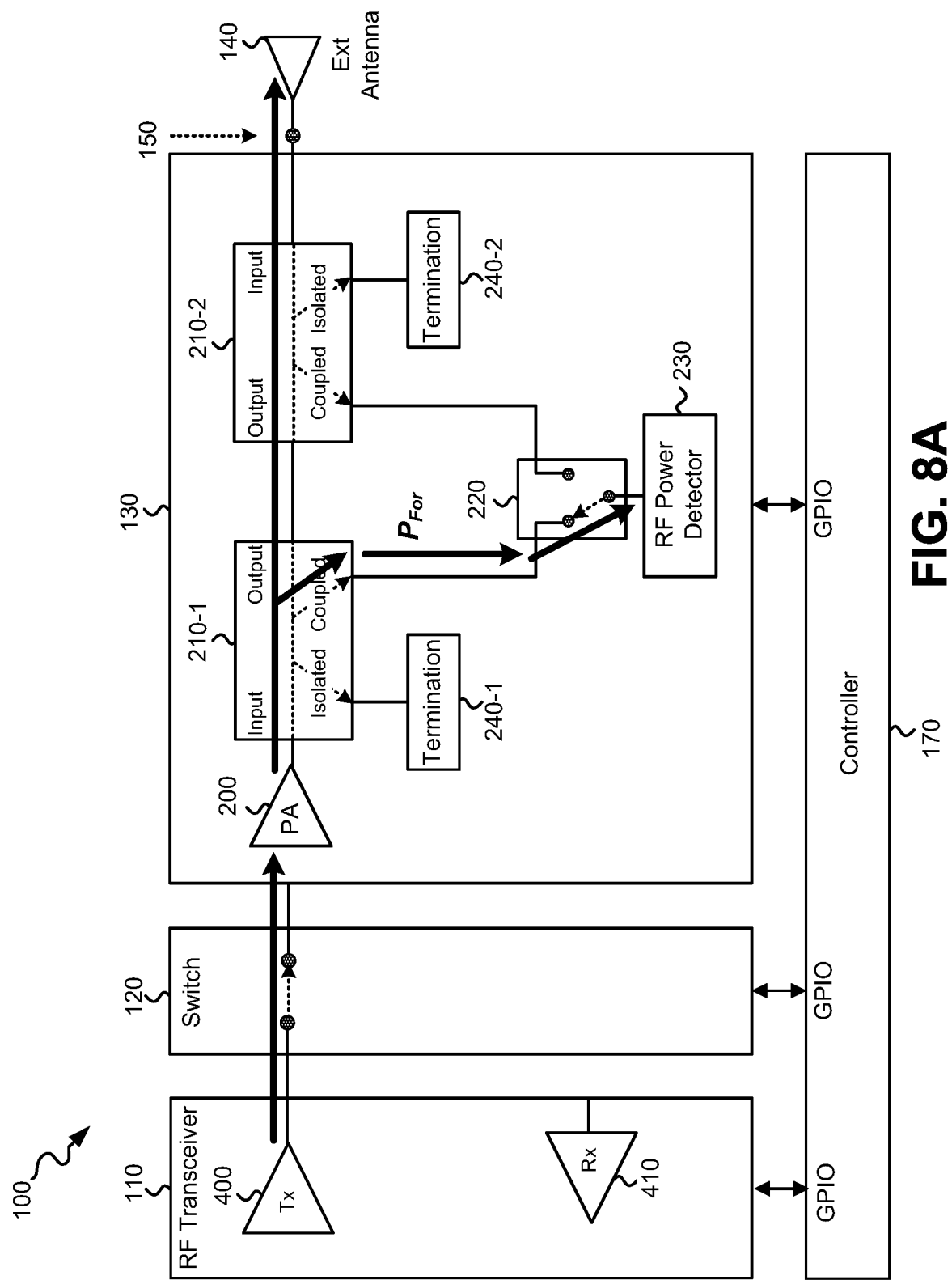
FIGS. 8A and 8B illustrate another exemplary implementation in which RF power measurements are performed by RF power detector circuitry of the front-end module of the wireless device of FIG. 1.
Figure 8B:
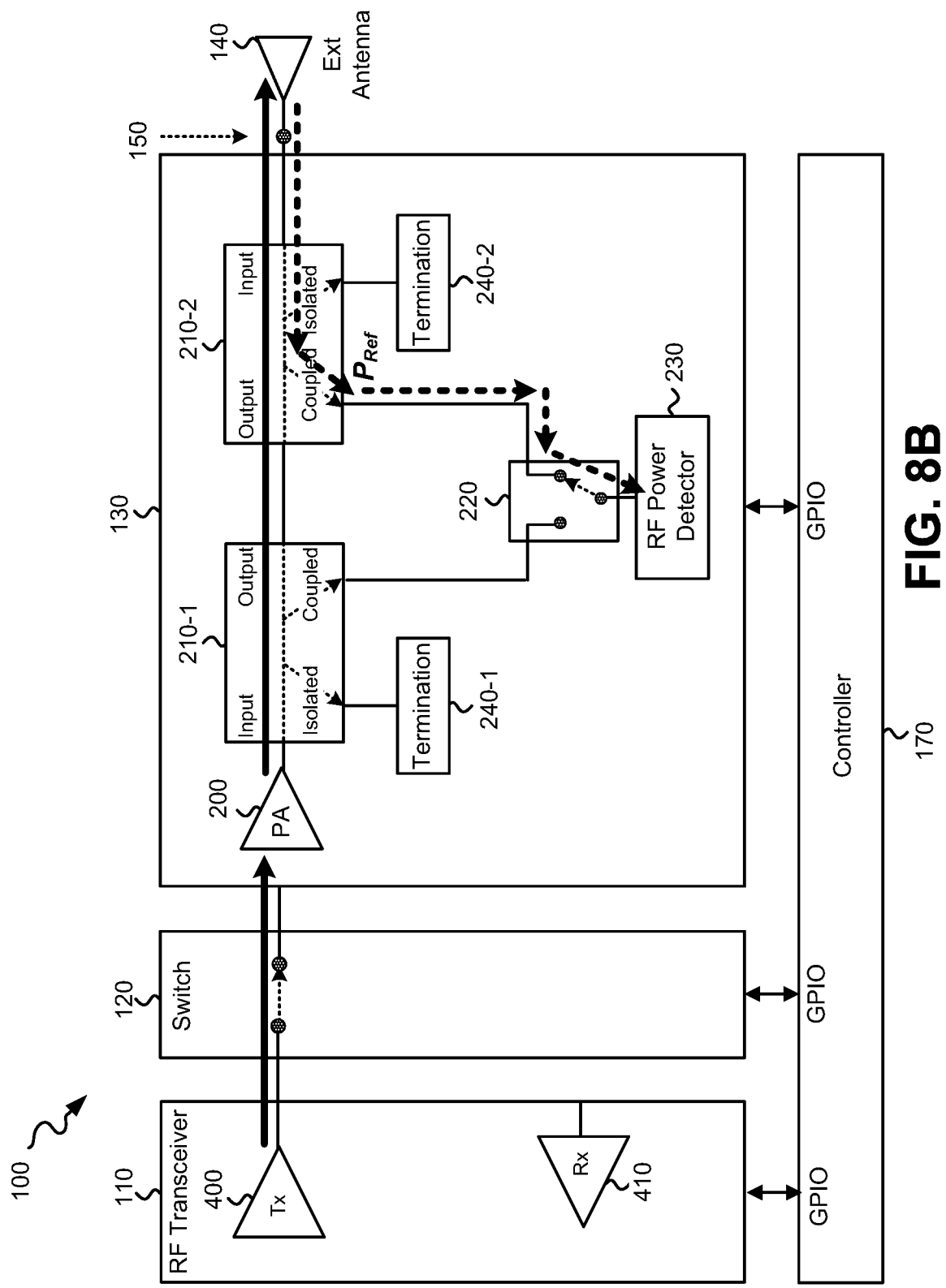

FIGS. 8A and 8B illustrate another exemplary implementation in which RF power measurements are performed by RF power detector circuitry of FEM 130 of wireless device 100. In this implementation, two directional couplers 210-1 and 210-2 are used to measure forward power applied to an external antenna, and reflected power reflected from the external antenna. As shown, directional coupler 210-1 is connected within the transmission path between Tx 400 and connector terminal 150 in a forward orientation (i.e., the forward RF power from Tx 400 transits the coupler from input port to output port), and directional 210-2 is connected within the transmission path in a reverse orientation (i.e., the forward RF power from Tx 400 transits the coupler from output port to input port).

In a first mode of operation shown in FIG. 8A, RF power from the transmitter Tx 400 is amplified by power amplifier 200 and supplied to the input port of coupler 210-1. The forward RF power transits the main line (shown via a bold solid line in FIG. 8A) in coupler 210-1 to exit the output port of coupler 210-1, and then supplied to the output port of coupler 210-2. A portion of the forward RF power ($P_{For}$) that is received at the input port of coupler 210-1 exits the coupled port of coupler 210-1 for measurement by RF power detector 230. The forward RF power then transits the main line (also shown via the bold solid line) in coupler 210-2 to exit the input port of coupler 210-2 and then encounter connector 150 and an external antenna 140 (if connected to connector 150). Switch 220 switches a connection from RF power detector 230 to the coupled port of coupler 210-1 enabling RF power detector 230 to measure the forward RF power $P_{For}$. Switch 220, in one implementation, may include a single pole, double throw (SPDT) switch that may, for example, be implemented by one or more solid state devices. RF power detector 230 measures a power level associated with RF signals received via the coupled port of directional coupler 210-1 and converts the measured power level to a corresponding DC voltage level. Controller 170 receives the DC voltage level, that equates to the level of the forward RF power $P_{For}$ detected by RF power detector 230.

In a second mode of operation shown in FIG. 8B, switch 220 switches a connection from RF power detector 230 to the coupled port of coupler 210-2 enabling RF power detector 230 to measure the reflected RF power $P_{Ref}$. In this mode, the RF power that exits the input port of coupler 210-2 transits to RF connector 150, and onward to antenna 140 if antenna 140 is connected to RF connector 150. If antenna 140 is connected to RF connector 150, upon receipt of the RF power that exited coupler 210-2, a portion of the RF power incident at antenna 140 reflects from antenna 140 and transits in a reverse direction through RF connector 150 and back through the input port of coupler 210-2 (shown via a bold dashed line in FIG. 8B), and out through the coupled port of coupler 210-2. The reflected power received via the coupled port of coupler 210-2 may then be measured by RF power detector 230 of FEM 130 as an amount of RF power reflected ("reflected power" $P_{Ref}$) from the connected antenna 140, or from the RF connector 150 itself if no antenna 140 is connected. RF power detector 230 measures a power level associated with RF signals received via the coupled port of coupler 210-2 and switch 220, and converts the measured power level to a corresponding DC voltage level. Controller 170 receives the DC voltage level that equates to the level of the reflected RF power detected by RF power detector 230.

Subsequent to measurement of the RF forward power $P_{For}$ (FIG. 8A) and the RF reflected power $P_{Ref}$ (FIG. 8B), controller 170 may analyze the power measurements, received from RF power detector 230, to determine whether an antenna 140 is connected to RF connector 150. In one implementation, controller 170 may compare the RF forward power $P_{For}$ with the RF reflected power $P_{Ref}$ to determine if the RF reflected power is within a threshold value T of the RF forward power (e.g., $P_{For}$-$P_{Ref}$<T). A high RF reflected power, that is within a certain proximity to a value of the RF forward power, may indicate that no antenna 140 is connected to RF connector 150. A low RF reflected power, relative to the RF forward power, may, however, indicate that an antenna 140 is connected to RF connector 150.

Figure 9:
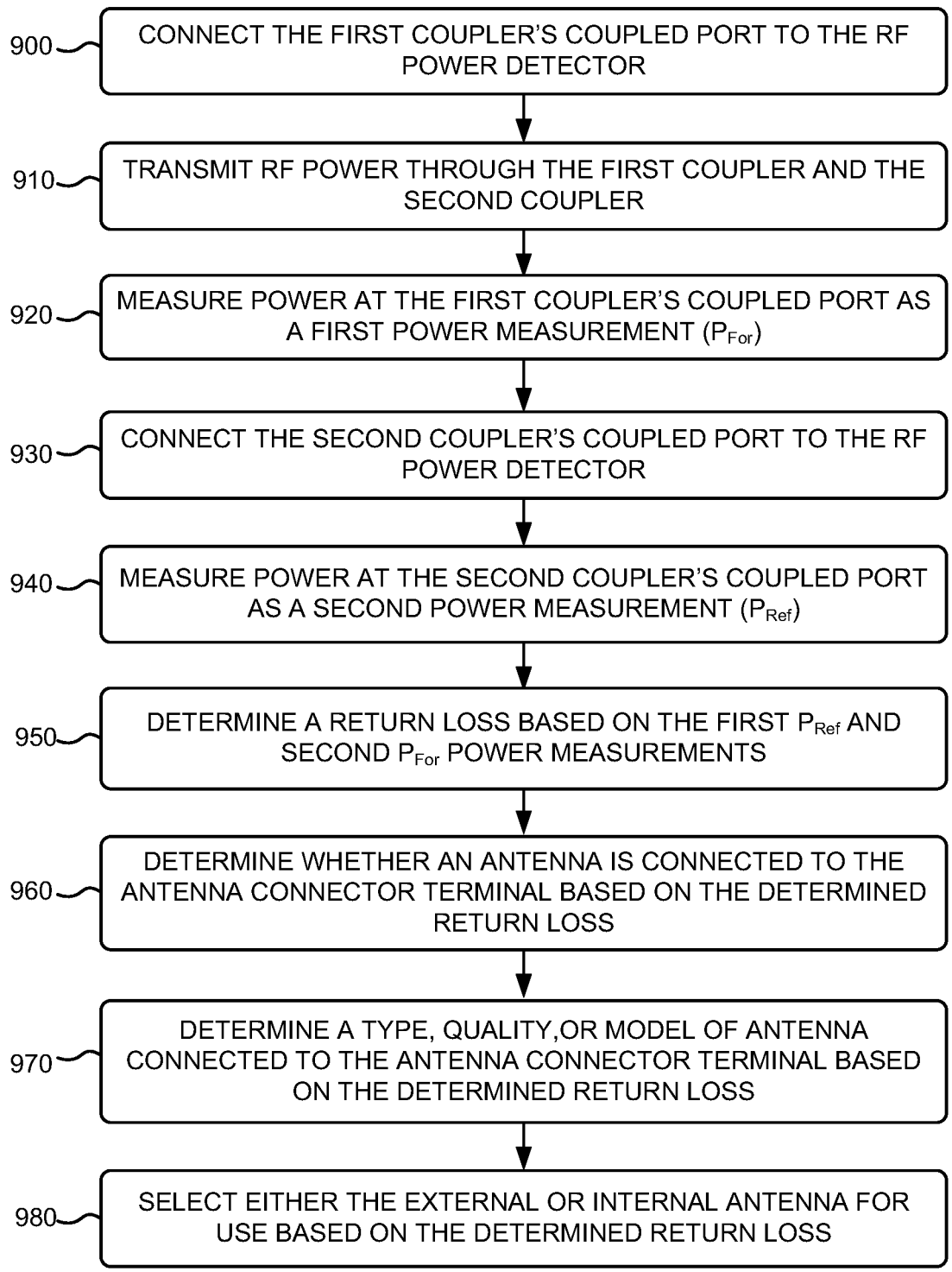
FIG. 9 illustrates an additional exemplary process for detecting whether an antenna is connected to the antenna connector terminal of the wireless device of FIG. 1 based on return loss measurements.

FIG. 9 illustrates an additional exemplary process for detecting whether an antenna 140 is connected to the antenna connector terminal 150 of a wireless device 100 based on return loss measurements. The exemplary process of FIG. 9 may, in some implementations, be implemented by the components of wireless device 100, such as by the components of the exemplary embodiment described above with respect to FIGS. 8A and 8B. In other implementations, the exemplary process of FIG. 9 may be implemented by the components of wireless device 100 in conjunction with at least one external device or module. In further implementations, certain blocks of the process of FIG. 9 may be performed manually.

The exemplary process includes controller 170 issuing an instruction to FEM 130 to cause switch 220 to connect coupler 210-1's coupled port to RF power detector 230 (block 900). In the embodiment of FIGS. 8A and 8B, controller 170 issues an instruction to FEM 130 to cause switch 220 to close a connection between RF power detector 230 and the coupled port of coupler 210-1.

Controller 170 issues an instruction to cause transmitter Tx 400 of RF transceiver 110 to transmit power through couplers 210-1 and 210-2 (block 910). Upon receipt of the instruction from controller 170, transmitter Tx 400 generates RF power and transmits the RF power through switch 120 for amplification by power amplifier 200 of FEM 130. Power amplifier 200 transmits the amplified RF power through coupler 210-1 (input port to output port), and through coupler 210-1 (output port to input port) to exit coupler 210-2's input port and proceed to any connected antenna 140 via RF antenna connector terminal 150.

Controller 170 issues an instruction to cause the measurement of RF power at the coupler 210-1's coupled port as a first power measurement (e.g., a forward power measurement $P_{For}$) (block 920). As shown in FIG. 8A, a portion of the forward RF power, transiting from PA 200 through coupler 210-1, exits the coupled port of coupler 210-1. The forward RF power proceeds through the connection of switch 220 between the coupled port of coupler 210-1 and the RF power detector 230 located within, or coupled to, FEM 130 such that RF power detector 230 can measure the incident RF power level associated with the forward RF power. The RF power detector 230 generates a DC voltage level that corresponds to the power level of the forward power $P_{For}$ and supplies an indication of the DC voltage level to controller 170. Controller 170 may store the indication of the measured forward power $P_{For}$ in the memory associated with controller 170.

Controller 170 issues an instruction to FEM 130 to cause switch 220 to connect coupler 210-2's coupled port to RF power detector 230 (block 930). In the embodiment of FIGS. 8A and 8B, controller 170 issues an instruction to FEM 130 to cause switch 220 to open the connection between RF power detector 230 and the coupled port of coupler 210-1, and to close the connection between RF power detector 230 and the coupled port of coupler 210-2. 170.

Controller 170 issues an instruction to cause the measurement of RF power at the coupler 210-2's coupled port as a second power measurement (e.g., a reflected power measurement $P_{Ref}$) (block 940). From the execution of block 910 above, RF power continues to be supplied through couplers 210-1 and 210-2 to antenna connector terminal 150 and external antenna 140. As shown in FIG. 8B, if an antenna 140 is connected to antenna connector terminal 150, a portion of the transmitted forward RF power reflects from the antenna 140 back through coupler 210-2 and out the coupled port of coupler 210-2. The reflected RF power exits the coupled port of coupler 210-2, and proceeds through the connection of switch 220 between the coupled port of coupler 210-2 and the RF power detector 230 located within, or coupled to, FEM 130 such that RF power detector 230 can measure the incident RF power level associated with the reflected RF power. The RF power detector 230 generates a DC voltage level that corresponds to the power level of the reflected power $P_{Ref}$ and supplies an indication of the DC voltage level to controller 170.

Controller 170 determines a return loss based on the first ($P_{For}$) and second ($P_{Ref}$) power measurements (block 950)). Controller 170 may, for example, determine the return loss (RL) using the following relation:

$$RL = 10 * \log(P_{For}/P_{Ref})$$ Eqn. (1)

Controller 170 determines whether an antenna 140 is connected or coupled to the antenna connector terminal 150 based on the determined return loss (block 960). For example, if the return loss RL is low, then controller 170 may determine that an antenna 140 is not connected or coupled to the connector terminal 150. If the return loss RL is high, then controller 170 may determine that an antenna 140 is connected or coupled to the connector terminal 150. In one implementation, controller 170 may compare the return loss RL with a return loss threshold $RL_{Th}$ to determine whether an antenna is connected to the connector terminal 150. For example, if $RL < RL_{Th}$, then controller 170 may determine that no antenna 140 is connected to the connector terminal 150. As another example, if $RL > RL_{Th}$, then controller 170 may determine that an antenna 140 is connected to the connector terminal 150. In one exemplary implementation, controller 170 may determine that an antenna 140 is not connected to antenna connector terminal 150 if RL is less than or equal to 5 dB, and may further determine that an antenna 140 is connected to antenna connector terminal 150 if RL is greater than or equal to 10 dB. Other values of $RL_{Th}$ may, however, be used. In some implementations, controller 170 may select the use of either external antenna 140 or internal antenna 160 based on the determination of whether external antenna 140 is connected to connector terminal 150. Therefore, if in block 960, controller 170 determines that an external antenna 140 has been connected to connector terminal 150, controller 170 may then, via switch 120, connect the transmitter Tx, or receiver Rx, of RF transceiver 110 to the external antenna 140 for transmission or reception.

Additionally, or alternatively, controller 170 may determine a type, quality, or model of an antenna 140 connected to the connected terminal 150 based on the determined return loss (block 970). For example, the return loss may be related to the standing wave ratio (SWR) of the connected antenna 140 and, therefore, can be indicative of a quality of the antenna 140. Additionally, different types or models of antennas may have different, but known, return losses and, therefore, the measured return loss RL of the connected antenna 140 may be used as a basis for identifying the type or model of antenna. Controller 170 may, thus, use the return loss determined in block 950 for identifying a type, quality, and/or model of any antenna 140 connected to the connected terminal 150. For example, controller 170 may store a database of return loss values for various types of external antennas and identify the particular antenna based on a lookup, using the determined return loss, into the database. In some circumstances, or certain implementations, block 970 may be omitted from the exemplary process of FIG. 9.

Additionally, or alternatively, controller 170 may select either external antenna 140 or internal antenna 160 for use in transmission and/or reception based on the determined return loss (block 980). For example, controller 170 may select the use of either external antenna 140 or internal antenna 160 based on whether the return loss determination indicates that the external antenna 140 is connected to connector terminal 150 and/or based on a determined quality, type, and/or model of the connected external antenna. For example, a particular type of external antenna 140 may have superior transmission/reception parameters than the internal antenna 160 of wireless device 100. Therefore, in the exemplary process of FIG. 9, controller 170 may determine that the particular type of external antenna 140 has been connected to connector terminal 150, and the controller 170 may then, via switch 120, connect the transmitter Tx, or receiver Rx, of RF transceiver 110 to the external antenna 140 for improved transmission or reception (e.g., better transmission signal quality) relative to using internal antenna 160. In some circumstances, or certain implementations, block 980 may be omitted from the exemplary process of FIG. 9.

The order of the execution of the blocks of the process of FIG. 9 may be altered in certain implementations. For example, the reverse RF power measurement of block 940 may be executed before the forward RF power measurement of block 920.

The antenna detection techniques described herein may be performed in conjunction with other antenna detection techniques, such as the antenna detection techniques, using an oscillator circuit, described in U.S. application Ser. No.

16/832,421 (corresponding to U.S. Provisional Application No. 62/825,885), or the antenna detection techniques, using noise measurements, described in U.S. application Ser. No. 16/832,539 (corresponding to U.S. Provisional Application No. 62/828,105). U.S. application Ser. No. 16/832,421 and U.S. application Ser. No. 16/832,539 are incorporated by reference herein in their entireties. The antenna detection techniques described herein, and the antenna detection techniques described in U.S. application Ser. No. 16/832,421 and U.S. application Ser. No. 16/832,539 may be selectively used relative to one another, may be performed in series, or may be performed in parallel, to detect the presence or absence of an antenna connected or coupled to a port or antenna connector terminal of a wireless device 100, such as a Meter Interface Unit (MIU). For example, a wireless device 100 may execute the exemplary process of FIG. 6 of U.S. application Ser. No. 16/832,539 in parallel with the exemplary process of FIGS. 7A and 7B or FIG. 9 of the present application and the exemplary process of FIG. 5 of U.S. application Ser. No. 16/832,421. As another example, the wireless device 100 may selectively execute one of: 1) the exemplary process of FIG. 6 of U.S. Application Ser. No. 16/832,539; 2) the exemplary process of FIGS. 7A and 7B or FIG. 9 of the present application (that corresponds to U.S. Provisional Application No. 62/835,669); or 3) the exemplary process of FIG. 5 of U.S. application Ser. No. 16/832,421 based on certain criteria.

The foregoing description of implementations provides illustration and description, but is not intended to be exhaustive or to limit the invention to the precise form disclosed. Modifications and variations are possible in light of the above teachings or may be acquired from practice of the invention. For example, while series of blocks have been described with respect to FIGS. 7A and 7B, and FIG. 9, the order of the blocks may be varied in other implementations. Moreover, non-dependent blocks may be performed in parallel.

Certain features described above may be implemented as "logic," a "unit," or a "controller" that performs one or more functions. This logic, unit, or controller may include hardware, such as one or more processors, microprocessors, microcontrollers, application specific integrated circuits, or field programmable gate arrays, software, or a combination of hardware and software.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A wireless device, comprising:
a radio frequency (RF) connector configured to connect to an antenna;
a RF transmitter configured to transmit RF power to the RF connector;
a memory configured to store a first power measurement of previously transmitted RF forward power between the RF transmitter and the RF connector;
a power measurement unit configured to measure, as a second power measurement, a portion of the transmitted RF power that is reflected via the RF connector; and
a controller configured to:
retrieve the first power measurement from the memory,
determine a return loss based on the retrieved first power measurement and the second power measurement, and
perform at least one of:
determine if a first antenna is connected to the RF connector based on the determined return loss, or
determine a quality, type, or model of the first antenna connected to the RF connector based on the determined return loss.

2. The wireless device of claim 1, further comprising:
a first directional coupler; and
a second directional coupler,
wherein the first directional coupler includes a first port coupled to an output of the RF transmitter, a second port coupled to the second directional coupler, and a third port coupled to the power measurement unit, wherein the third port comprises a coupled port of the first directional coupler, and wherein the first directional coupler further includes a fourth port that comprises an isolated port of the first directional coupler, and
wherein the second directional coupler includes a first port coupled to the second port of the first directional coupler, a second port coupled to the RF connector, and a third port coupled to the power measurement unit, wherein the third port comprises a coupled port of the second directional coupler, and wherein the second directional coupler includes a fourth port that comprises an isolated port of the second directional coupler.

3. The wireless device of claim 2, wherein the RF transmitter is further configured to transmit the RF power to the RF connection through the first directional coupler and the second directional coupler and wherein the power measurement unit is configured to:
measure the first power measurement via the coupled port of the first directional coupler; and
measure the second power measurement via the coupled port of the second directional coupler;
wherein the controller is further configured to store the first power measurement in the memory as the previously transmitted RF forward power.

4. The wireless device of claim 1, further comprising:
a directional coupler, wherein the directional coupler includes a first port coupled to an output of the RF transmitter, a second port coupled to the RF connector, and a third port coupled to the power measurement unit, wherein the third port comprises a coupled port of the directional coupler, and wherein the directional coupler further includes a fourth port that comprises an isolated port of the directional coupler.

5. The wireless device of claim 4, wherein, when the power measurement unit measures the portion of the transmitted RF power that is reflected via the RF connector, the power measurement unit is configured to measure the portion of the transmitted RF power via the coupled port of the directional coupler.

6. A method, comprising:
transmitting radio frequency (RF) power, from a transmitter, to an RF connector terminal of a wireless device, wherein the RF connector terminal is configured to connect to an external antenna of the wireless device;
measuring, as a first power measurement, first RF power, of the transmitted RF power, that is reflected via the RF connector terminal;
creating a transmission path discontinuity between an output of the transmitter and the RF connector terminal;
measuring, as a second power measurement, second RF power, of the transmitted RF power, that is reflected from the discontinuity; and
determining if an external antenna is connected to the RF connector terminal based on the first and second power measurements.

7. The method of claim 6, further comprising:
selecting either the external antenna, or an internal antenna of the wireless device, for transmission or reception based on the first and second power measurements.

8. The method of claim 6, wherein a switch is connected across the output of the transmitter to ground, and further comprising:
opening, prior to the first power measurement, the switch relative to ground, and
wherein creating the transmission path discontinuity comprises:
closing, subsequent to the first power measurement, the switch to short the output of the transmitter to ground.

9. The method of claim 6, wherein a switch is connected in series between the output of the transmitter and the RF connector terminal, and further comprising:
closing, prior to the first power measurement, the switch to electrically connect the output of the transmitter and the RF connector terminal, and
wherein creating the transmission path discontinuity comprises:
opening, subsequent to the first power measurement, the switch to create an open connection between the output of the transmitter and the RF connector terminal.

10. The method of claim 6, further comprising:
determining a return loss based on the first and second power measurements, and
performing at least one of:
determining if the antenna is connected to the RF connector terminal based on the determined return loss, or
determining a quality, type, or model of an antenna connected to the RF connector terminal based on the determined return loss.

11. The method of claim 6, wherein transmitting the RF power to the RF connector terminal further comprises:
transmitting the RF power through a directional coupler, wherein the directional coupler comprises a first port coupled to the output of the transmitter, a second port coupled to the RF connector terminal, and a third port coupled to a power measurement unit, wherein the third port comprises a coupled port of the directional coupler, and wherein the directional coupler further comprises a fourth port that includes an isolated port of the coupler, and
wherein measuring the first RF power and the second RF power further comprises:
measuring, as the first power measurement, the first RF power at the coupled port of the directional coupler; and
measuring, as the second power measurement, the second RF power at the coupled port of the directional coupler.

12. A system, comprising:
a radio frequency (RF) connector terminal configured to connect to an antenna;
a RF transmitter configured to transmit RF power to the RF connector terminal;
a power measurement unit configured to measure, as a first power measurement, first RF power, of the transmitted RF power, that is reflected via the RF connector terminal; and
a controller configured to cause a transmission path discontinuity between the RF transmitter and the RF connector terminal;
wherein the power measurement unit is further configured to measure, as a second power measurement, second RF power, of the transmitted RF power, that is reflected from the discontinuity, and
wherein the controller is further configured to determine if a first antenna is connected to the RF connector terminal based on the first and second power measurements.

13. The system of claim 12, further comprising:
a second antenna that comprises an internal antenna of the system, wherein the first antenna comprises an external antenna, and
wherein the controller is further configured to select either the external antenna, or the internal antenna, for transmission or reception based on the first and second power measurements.

14. The system of claim 12, wherein a switch is connected across an output of the RF transmitter to ground, and wherein the controller is configured to:
open, prior to the first power measurement, the switch relative to ground, and
wherein, when creating the transmission path discontinuity, the controller is further configured to:
close, subsequent to the first power measurement, the switch to short the output of the RF transmitter to ground.

15. The system of claim 12, wherein a switch is connected in series between an output of the RF transmitter and the RF connector terminal, and wherein the controller is configured to:
close, prior to the first power measurement, the switch to electrically connect the output of the RF transmitter and the RF connector terminal, and
wherein, when creating the transmission path discontinuity, the controller is further configured to:
open, subsequent to the first power measurement, the switch to create an open connection between the output of the RF transmitter and the RF connector terminal.

16. The system of claim 12, wherein the controller, when determining if an antenna is connected to the RF connector terminal, is further configured to:
determine a return loss based on the first and second power measurements, and
determine if an antenna is connected to the RF connector terminal based on the determined return loss.

17. The system of claim 12, wherein the controller is further configured to:
determine a return loss based on the first and second power measurements, and
determine a quality, type, or model of an antenna connected to the RF connector terminal based on the determined return loss.

18. The system of claim 12, further comprising:
a directional coupler coupled between the RF transmitter and the RF connector terminal, wherein the directional coupler comprises a first port coupled to the output of the RF transmitter, a second port coupled to the RF connector terminal, and a third port coupled to the power measurement unit, wherein the third port comprises a coupled port of the directional coupler, and wherein the directional coupler further comprises a fourth port that includes an isolated port of the directional coupler.

19. A wireless device, comprising:
a radio frequency (RF) connector configured to connect to an antenna;
a RF transmitter configured to transmit RF power to the RF connector;
a memory configured to store a first power measurement of previously transmitted RF forward power between the RF transmitter and the RF connector;
a power measurement unit configured to measure, as a second power measurement, a portion of the transmitted RF power that is reflected via the RF connector;
a controller configured to:
  retrieve the first power measurement from the memory, and
  determine if a first antenna is connected to the RF connector based on the retrieved first power measurement and the second power measurement;
a first directional coupler; and
a second directional coupler,
wherein the first directional coupler includes a first port coupled to an output of the RF transmitter, a second port coupled to the second directional coupler, and a third port coupled to the power measurement unit, wherein the third port comprises a coupled port of the first directional coupler, and wherein the first directional coupler further includes a fourth port that comprises an isolated port of the first directional coupler, and
wherein the second directional coupler includes a first port coupled to the second port of the first directional coupler, a second port coupled to the RF connector, and a third port coupled to the power measurement unit, wherein the third port comprises a coupled port of the second directional coupler, and wherein the second directional coupler includes a fourth port that comprises an isolated port of the second directional coupler.

20. The wireless device of claim 19, wherein the RF transmitter is further configured to transmit the RF power to the RF connection through the first directional coupler and the second directional coupler and wherein the power measurement unit is configured to:
measure the first power measurement via the coupled port of the first directional coupler; and
measure the second power measurement via the coupled port of the second directional coupler;
wherein the controller is further configured to store the first power measurement in the memory as the previously transmitted RF forward power.

21. A wireless device, comprising:
a radio frequency (RF) connector configured to connect to an antenna;
a RF transmitter configured to transmit RF power to the RF connector;
a memory configured to store a first power measurement of previously transmitted RF forward power between the RF transmitter and the RF connector;
a power measurement unit configured to measure, as a second power measurement, a portion of the transmitted RF power that is reflected via the RF connector;
a controller configured to:
  retrieve the first power measurement from the memory, and
  determine if a first antenna is connected to the RF connector based on the retrieved first power measurement and the second power measurement; and
a second antenna that comprises an internal antenna, wherein the first antenna comprises an external antenna, and
wherein the controller is further configured to select either the external antenna, or the internal antenna, for transmission or reception based on the retrieved first power measurement and the second power measurement.

22. A wireless device, comprising:
a radio frequency (RF) connector configured to connect to an antenna;
a RF transmitter configured to transmit RF power to the RF connector;
a memory configured to store a first power measurement of previously transmitted RF forward power between the RF transmitter and the RF connector;
a power measurement unit configured to measure, as a second power measurement, a portion of the transmitted RF power that is reflected via the RF connector;
a controller configured to:
  retrieve the first power measurement from the memory, and
  determine if a first antenna is connected to the RF connector based on the retrieved first power measurement and the second power measurement; and
a directional coupler, wherein the directional coupler includes a first port coupled to an output of the RF transmitter, a second port coupled to the RF connector, and a third port coupled to the power measurement unit, wherein the third port comprises a coupled port of the directional coupler, and wherein the directional coupler further includes a fourth port that comprises an isolated port of the directional coupler.

23. The wireless device of claim 22, wherein, when the power measurement unit measures the portion of the transmitted RF power that is reflected via the RF connector, the power measurement unit measures the portion of the transmitted RF power via the coupled port of the directional coupler.

24. The wireless device of claim 22, further comprising:
a switch connected between the third port of the directional coupler and ground; or
a switch connected in series between the third port of the directional coupler and the RF connector.

* * * * *